(12) United States Patent
Lee et al.

(10) Patent No.: US 9,721,899 B2
(45) Date of Patent: Aug. 1, 2017

(54) EMBEDDED COMPONENT PACKAGE STRUCTURE AND METHOD OF MANUFACTURING THE SAME

(71) Applicant: Advanced Semiconductor Engineering, Inc., Kaohsiung (TW)

(72) Inventors: Chih-Cheng Lee, Kaohsiung (TW); Hsing Kuo Tien, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/732,529

(22) Filed: Jun. 5, 2015

(65) Prior Publication Data

US 2016/0064329 A1    Mar. 3, 2016

(30) Foreign Application Priority Data

Aug. 26, 2014 (CN) .......................... 2014 1 0424606

(51) Int. Cl.
*H01L 23/552* (2006.01)
*H01L 23/538* (2006.01)
(Continued)

(52) U.S. Cl.
CPC .......... *H01L 23/5389* (2013.01); *H01L 23/36* (2013.01); *H01L 23/5383* (2013.01); (Continued)

(58) Field of Classification Search
CPC ....................... H01L 23/552; H01L 2924/3025
(Continued)

(56) References Cited

U.S. PATENT DOCUMENTS 6,709,897 B2    3/2004  Cheng et al.
7,989,944 B2    8/2011  Tuominen
(Continued)

FOREIGN PATENT DOCUMENTS

CN    101211903 A    7/2008
CN    102214626 A    10/2011
CN    102456584 A    5/2012

OTHER PUBLICATIONS

Search Report for Chinese Patent Application No. 201410424606.8, created on Jun. 23, 2016, 2 pages.

*Primary Examiner* — Tan N Tran
(74) *Attorney, Agent, or Firm* — Foley & Lardner LLP; Cliff Z. Liu

(57) ABSTRACT

An embedded component package structure includes a substrate. A first conductive component extends from a first surface of the substrate to a second surface of the substrate, a first conductive layer is disposed on the first surface of the substrate, and a second conductive layer is disposed on the second surface of the substrate and is electrically connected to the first conductive layer by the first conductive component. A die is disposed in a through hole in the substrate. A back surface of the die is exposed from the second surface of the substrate. A first dielectric layer covers an active surface of the die and the first surface of the substrate. A third conductive layer is disposed on the first dielectric layer and is electrically connected to the die by a second conductive component. A first metal layer is disposed directly on the back surface of the die.

13 Claims, 22 Drawing Sheets

(51) Int. Cl.
  *H01L 23/00* (2006.01)
  *H01L 23/36* (2006.01)
  *H01L 25/16* (2006.01)
  *H01L 21/48* (2006.01)
  *H01L 21/56* (2006.01)

(52) U.S. Cl.
  CPC ............ *H01L 23/552* (2013.01); *H01L 24/19* (2013.01); *H01L 24/20* (2013.01); *H01L 21/4857* (2013.01); *H01L 21/568* (2013.01); *H01L 25/16* (2013.01); *H01L 2224/04105* (2013.01); *H01L 2224/12105* (2013.01); *H01L 2224/131* (2013.01); *H01L 2224/16225* (2013.01); *H01L 2224/16227* (2013.01); *H01L 2224/18* (2013.01); *H01L 2224/32245* (2013.01); *H01L 2224/73267* (2013.01); *H01L 2924/15153* (2013.01); *H01L 2924/15313* (2013.01); *H01L 2924/18162* (2013.01); *H01L 2924/19105* (2013.01); *H01L 2924/3025* (2013.01); *H01L 2924/3511* (2013.01)

(58) Field of Classification Search
  USPC ................................................. 257/659, 660
  See application file for complete search history.

(56) References Cited

U.S. PATENT DOCUMENTS

| | | | |
|---|---|---|---|
| 8,399,778 | B2 | 3/2013 | Hsu |
| 8,432,022 | B1 | 4/2013 | Huemoeller et al. |
| 2006/0145328 | A1* | 7/2006 | Hsu .................... H01L 23/5389 257/690 |
| 2008/0007927 | A1 | 1/2008 | Ito et al. |
| 2008/0157341 | A1 | 7/2008 | Yang et al. |
| 2012/0104590 | A1 | 5/2012 | Do et al. |
| 2012/0153493 | A1 | 6/2012 | Lee et al. |
| 2013/0299971 | A1 | 11/2013 | Do et al. |
| 2014/0246227 | A1* | 9/2014 | Lin .................... H01L 23/5389 174/266 |

\* cited by examiner

EMBEDDED COMPONENT PACKAGE STRUCTURE AND METHOD OF MANUFACTURING THE SAME

CROSS REFERENCE TO RELATED APPLICATIONS

This application claims the benefit of and priority to Chinese patent application No. 201410424606.8, filed on 26 Aug. 2014, the contents of which are incorporated herein by reference in their entireties.

BACKGROUND

1. Technical Field

The present disclosure relates to a semiconductor package and a method of manufacturing the same.

2. Description of the Related Art

Semiconductor components have become progressively more complex, driven at least in part by a demand for smaller components and enhanced performance.

SUMMARY

In an embodiment, an embedded component package structure includes a substrate with a first surface and a second surface opposite the first surface, the substrate defining a through hole extending from the first surface to the second surface. A first conductive component extends from the first surface of the substrate to the second surface of the substrate, a first conductive layer is disposed on the first surface of the substrate, and a second conductive layer is disposed on the second surface of the substrate and is electrically connected to the first conductive layer by the first conductive component. A die is disposed in the through hole. The die has an active surface and a back surface opposite the active surface, the back surface exposed from the second surface of the substrate. A first dielectric layer covers the active surface of the die and the first surface of the substrate. The structure further includes a second conductive component, a third conductive layer disposed on the first dielectric layer and electrically connected to the die by the second conductive component, and a first metal layer disposed directly on the back surface of the die.

In an embodiment, a method for manufacturing an embedded component package structure includes providing a substrate having an upper surface and a lower surface; forming a first through hole extending from the upper surface of the substrate to the lower surface of the substrate; forming a conductive component in the first through hole; and forming a first conductive layer on the upper surface of the substrate, wherein the first conductive layer electrically connects to the conductive component. The method further includes forming a second through hole next to the first through hole, the second through hole extending from the upper surface of the substrate to the lower surface of the substrate; disposing an adhesive film on the lower surface of the substrate, the adhesive film covering at least a portion of the second through hole; and disposing a die in the second through hole and attaching the die on the adhesive film. The method further includes providing a dielectric layer covering the upper surface of the die; removing the adhesive film so as to expose a back surface of the die; and forming a first metal layer on the back surface of the die.

In an embodiment, a method for manufacturing an embedded component package structure includes providing a substrate having an upper surface and a lower surface; forming a first conductive layer on the upper surface of the substrate; forming a first through hole extending from the upper surface of the substrate to the lower surface of the substrate; disposing an adhesive film on the lower surface of the substrate, the adhesive film covering at least a portion of the first through hole; and disposing a die in the first through hole by attaching the die to the adhesive film. The method further includes providing a dielectric layer covering the upper surface of the die; removing the adhesive film so as to expose a back surface of the die; forming a second through hole extending from the lower surface of the substrate to the upper surface of the substrate; forming a conductive component in the second through hole, the conductive component electrically connecting to the first conductive layer; and forming a first metal layer directly on the back surface of the die.

DETAILED DESCRIPTION

There is a demand to reduce a size of many electronic products, and thereby a demand to reduce sizes of included semiconductor components. One technique for including a semiconductor component in an electronic product includes placing a semiconductor device on a substrate including electrical circuitry, such as a circuit board, and subsequently packaging the electronic device to obtain the semiconductor component; however, this results in a portion of the surface area of the substrate being occupied by the semiconductor component. Thus, in one or more embodiments of the present disclosure, a semiconductor device (or a semiconductor component) is embedded within a substrate to make available more surface area of the substrate for other components, and to simplify manufacturing processes. Further, in one or more embodiments, a heat dissipation structure is provided for the semiconductor device or component. A resulting embedded component package structure allows for a reduction in a size of an associated electronic product.

Figure 1A:
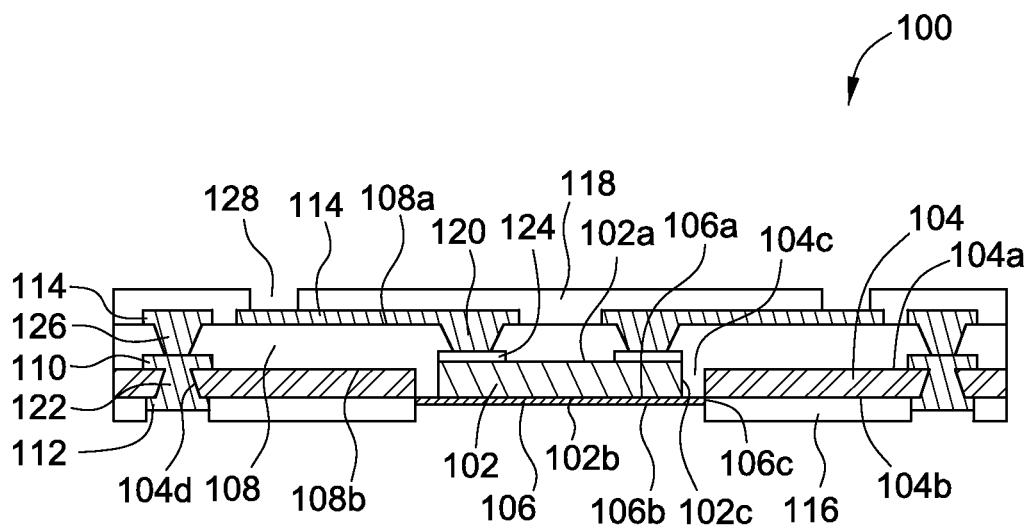
FIG. 1A is a cross-sectional view of an embedded component package structure according to an embodiment of the present disclosure.

FIG. 1A illustrates a cross-sectional view of an embedded component package structure 100 according to one or more embodiments of the present disclosure. The embedded component package structure 100 includes a semiconductor device 102 (referred to herein as a die 102 for simplicity, and not in a limiting fashion), a substrate 104, a first metal layer 106, a first dielectric layer 108, a first patterned conductive layer 110, a second patterned conductive layer 112, a third patterned conductive layer 114, and a solder mask layer 116.

The die 102 includes an active surface 102a, a back surface 102b opposite the active surface 102a, and side surfaces 102c. The back surface 102b is in direct contact with the first metal layer 106. The die 102 includes a die pad 124, or multiple die pads 124.

The substrate 104 includes a first surface 104a and a second surface 104b opposite the first surface 104a. In one or more embodiments, the substrate 104 defines a first through hole 104c, or multiple first through holes 104c, extending from the first surface 104a to the second surface 104b, for receiving one or more dies 102. A width and a shape of the first through hole 104c can be designed in accordance with a size and a shape of the die 102, and in embodiments in which more than one die 102 is to be positioned within the first through hole 104c, the width and the shape of the first through hole 104c may be designed to accommodate the multiple dies 102. The width of the first through hole 104c is greater than or equal to a width of the die 102 so as to contain the die.

In one or more embodiments, the width of the first through hole 104c is greater than the width of the die 102, such that there is a space between side walls of the first through hole 104c and the side walls 102c of the die 102. A depth of the first through hole 104c may be greater than, equal to, or less than a height of the die 102. In one or more embodiments, the height of the die 102 is greater than the depth of the first through hole 104c, thereby reducing a height of an electrical interconnection 120 (described below as a second electrical interconnection 120). For example, in embodiments in which the second electrical interconnection 120 is formed by plating, a plating process may be controlled better when the depth of the first through hole 104c is less than the height of the die 102; this improved control allows for finer pitch between input/output (I/O) connections, for example. In other embodiments, the height of the die 102 is not larger than (e.g., is less than or equal to) the depth of the first through hole 104c, thereby reducing a thickness of the first dielectric layer 108; in such embodiments, a thickness of the embedded component package structure 100 may be reduced. A side wall of the first through hole 104c may have a slope (not shown), such that a portion of the side wall close to the second surface 104b of the substrate 104 (in the orientation of FIG. 1A) is farther from the die than a portion of the side wall close to the first surface 104a of the substrate 104; in such embodiments, an area of the plated first metal layer 106 may be increased, and the increased area may, in some embodiments, improve a uniformity in thickness of the plated first metal layer 106. In one or more embodiments, a sloped side wall may have an arc-shaped slope.

In the embodiment shown in FIG. 1A, the back surface 102b of the die 102 is substantially coplanar with the second surface 104b of the substrate 104; however, in other embodiments, the back surface 102b of the die 102 is lower than the second surface 104b of the substrate 104 in the orientation shown in FIG. 1A (see, for example, the relative positioning of a second surface 304b to a back surface 302b in the package structure 300 shown in FIG. 3C, discussed below).

As shown in FIG. 1A, the substrate 104 further defines a second through hole 104d, or multiple second through holes 104d, extending from the first surface 104a of the substrate 104 to the second surface 104b of the substrate 104. The second through hole 104d may be any suitable shape, including, but not limited to: columnar (such as cylindrical, elliptic columnar, square columnar, rectangular columnar, or other columnar shape) or non-columnar (such as conical, funnel-shaped, or other non-columnar shape). A side wall of the second through hole 104d may be in the shape of an arc. The side wall of the second through hole 104d may have a texture. A first electrical interconnection 122 may be disposed within the second through hole 104d. In one or more embodiments, an area of the first electrical interconnection 122 that is exposed from the first surface 104a of the substrate 104 is smaller than an area of the first electrical interconnection 122 that is exposed from the second surface 104b of the substrate 104.

In one or more embodiments, the substrate 104 is a core substrate, which may be, or may include, a polymeric or a non-polymeric material. For example, the core substrate may include, without limitation to, C-stage resin materials, such as Ajinomoto build-up film (ABF), bismaleimide triazine (BT) resin, polyimide, or the like, or other suitable materials. For another example, a resin material used in the core substrate may be a fiber-reinforced resin so as to strengthen the core substrate, and the reinforcing fibers may be, without limitation to, glass fibers or Kevlar fibers (aramid fibers).

The first metal layer 106 has an upper surface 106a, a lower surface 106b and side surfaces 106c. The first metal layer 106 is disposed directly on the back surface 102b of the die 102. The first metal layer 106 may facilitate heat dissipation of the die 102. The first metal layer 106 may cover the entirety of the back surface 102b or a portion of the back surface 102b. In one or more embodiments, the first metal layer 106 extends laterally along the back surface 102b of the die 102 and extends onto the lower surface 108b of the first dielectric layer 108, such as extending to a position located between the side surface 102c of the die 102 and the side wall of the first through hole 104c, or extending to the side wall of the first through hole 104c, thereby providing a larger area for heat dissipation.

The first metal layer 106 includes a metal or metals, a metal alloy or alloys, a material with metal(s) and/or metal alloy(s) dispersed within, or a combination thereof. For example, the first metal layer 106 may include aluminum, copper, titanium or a combination thereof. The first metal layer 106 may be formed of multiple layers of the same or different materials.

The back surface 106b of the first metal layer 106 may be provided with a surface finish layer (not shown). The surface finish layer may include a metal or metals, a metal alloy or alloys, a material with metal(s) or metal alloy(s) dispersed within, or a combination thereof. For example, the surface finish layer may include aluminum, copper, titanium, tin, nickel, gold or a combination thereof. The material of the surface finish layer may be the same as, or different from, the material of the first metal layer 106.

The first patterned conductive layer 110 is disposed on the first surface 104a of the substrate 104, and the second patterned conductive layer 112 is disposed on the second surface 104b of the substrate 104. The first patterned conductive layer 110 electrically connects to the second patterned conductive layer 112 through the first electrical interconnection 122.

The solder mask layer 116 is disposed on the second surface 104b of the substrate 104. The solder mask layer 116 defines openings exposing the second patterned conductive layer 112 and the first metal layer 106. By extending beyond the second patterned conductive layer 112 and the first metal layer 106, the solder mask layer 116 may serve to protect the second patterned conductive layer 112 and the first metal layer 106. The solder mask layer 116 may be, for example, a photosensitive dry film or other patternable material, such as polyimide. The solder mask layer 116 may be a solder resist. The openings defined by the solder mask layer 116 expose a portion of the second patterned conductive layer for external electrical connection. The openings defined by the solder mask layer 116 may be any suitable shape, including without limitation: columnar (such as cylindrical, elliptic columnar, square columnar, rectangular columnar, or other columnar shape) or non-columnar (such as conical, funnel-shaped, or other non-columnar shape). A side wall of an opening defined by the solder mask layer 116 may be in the shape of an arc. A side wall of an opening defined by the solder mask layer 116 may have a texture.

The first dielectric layer 108 has an upper surface 108a and a lower surface 108b. The first dielectric layer 108 is disposed on the upper surface 104a of the substrate 104 and the active surface 102a of the die 102. In one or more embodiments, the first dielectric layer 108 occupies and fills a space between a side wall of the first through hole 104c of the substrate 104 and the side surfaces 102c of the die 102. As shown in FIG. 1A, in such embodiments, a portion of the lower surface 108b of the first dielectric layer 108 contacts the upper surface 106a of the first metal layer 106. The first dielectric layer 108 may be, or may include, a polymeric or a non-polymeric dielectric material. For example, the first dielectric layer 108 may include a flowable dielectric material in a hardened or semi-hardened state, such as, for example, a liquid crystal polymer, prepreg, Ajinomoto build-up film, a resin, an epoxy compound, or the like. In one or more embodiments, the first dielectric layer 108 includes a single resin layer. In other embodiments, the first dielectric layer 108 includes multiple resin layers; for example, a first sub-layer formed of a resin and a second sub-layer formed of an enhanced resin (such as a resin enhanced by glass fibers or Kevlar fibers). In one or more embodiments, the first dielectric layer 108 includes prepreg, and the prepreg may be in a single layer or multiple layers. In one or more embodiments, the first dielectric layer 108 includes at least one prepreg layer and at least one resin layer.

The first dielectric layer 108 defines a through hole, or multiple through holes, extending from the upper surface 108a of the first dielectric layer 108 to the pad(s) 124 of the die 102 so as to expose the pad(s) 124; the second electrical interconnection 120 is disposed in a respective such through hole. The first dielectric layer 108 further defines a through hole, or multiple through holes, extending from the upper surface 108a of the first dielectric layer 108 to the first patterned conductive layer 110; a third electrical interconnection 126 is disposed in a respective such through hole. In one or more embodiments, an area of the third electrical interconnection 126 that is exposed to the first patterned conductive layer 110 is smaller than an area of the third electrical interconnection 126 that is exposed from the upper surface 108a of the first dielectric layer 108 (in other words, a narrower portion of the third electrical interconnection 126 is oriented toward the first electrical interconnection 122). In one or more embodiments, an area of the second electrical interconnection 120 that is exposed to the pad 124 of the die 102 is smaller than an area of the second electrical interconnection 120 that is exposed from the upper surface 108a of the first dielectric layer 108. As can be seen, a tapering of a geometric shape of the first electrical interconnection 122 may be in an opposite direction from a tapering of a geometric shape of one or both of the second electrical interconnection 120 or the third electrical interconnection 126; with this structure, a stress of the substrate may be reduced, thereby reducing warpage of the substrate. In addition, in one or more embodiments, the first electrical interconnection 122 is staggered from the second electrical interconnection 120 and the third electrical interconnection 126, so that the stress and warpage of the substrate can be further reduced.

The third patterned conductive layer 114 is disposed on the upper surface 108a of the first dielectric layer 108. The third patterned conductive layer 114 electrically connects to the pad 124 through the second electrical interconnection 120, and electrically connects to the first patterned conductive layer 110 through the third electrical interconnection 126.

A second dielectric layer 118 is disposed on the first dielectric layer 108 and the third patterned conductive layer 114. The second dielectric layer 118 defines openings 128 exposing portions of the third patterned conductive layer 114 for external electrical connection. The second dielectric layer 118 may be, or may include, a photosensitive dry film or other patternable material, such as polyimide. In one or more embodiments, the second dielectric layer 118 is a solder mask or a solder resist layer. The openings 128 may be of any suitable shape, including but not limited to: columnar (such as cylindrical, elliptic columnar, square columnar, rectangular columnar, or other columnar shape) or non-columnar (such as conical, funnel-shaped, or other non-columnar shape). A side wall of an opening 128 may be in the shape of an arc. The side wall of the opening 128 may have a texture.

The first dielectric layer 108 and the second dielectric layer 118 may be made of the same material. In one or more embodiments, the first dielectric layer 108 and the second dielectric layer 118 may join such that a boundary between the first dielectric layer 108 and the second dielectric layer 118 is not plainly evident. Although FIG. 1A illustrates a single layer for first dielectric layer 108 and single layer for second dielectric layer 118, in one or more embodiments, one or both of the first dielectric layer 108 and the second dielectric layer 118 may include two or more layers.

The first, second and third electrical interconnections 122, 120 and 126, respectively, may be, or may include, any suitable conductive material. For example, the first, second and third electrical interconnections 122, 120 and 126, respectively, may include a metal or metals, a metal alloy or alloys, a material with metal(s) or metal alloy(s) dispersed within, or a combination thereof. For example, the first, second and third electrical interconnections 122, 120 and 126, respectively, may include aluminum, copper, titanium or a combination thereof. The first, second and third patterned conductive layers 110, 112 and 114, respectively, may be, or may include, any suitable conductive material. For example, the first, second and third patterned conductive layers 110, 112 and 114, respectively, may include a metal or metals, a metal alloy or alloys, a material with metal(s) or metal alloy(s) dispersed within, or a combination thereof. For example, the first, second and third patterned conductive layers 110, 112 and 114, respectively, may include aluminum, copper, titanium or a combination thereof. Each of the first electrical interconnections 122, the second electrical interconnections 120, the third electrical interconnections 126, the first patterned conductive layers 110, the second patterned conductive layers 112, and the third patterned conductive layers 114 may be, or may include, a different material; alternatively, two or more may be, or may include a same material.

The embedded component package structure 100 may further include a shield, to shield the die 102 from electromagnetic influences such as, for example, interference due to signals from another embedded die or other electronic components, or influences from external to the package structure.

Figure 1B:
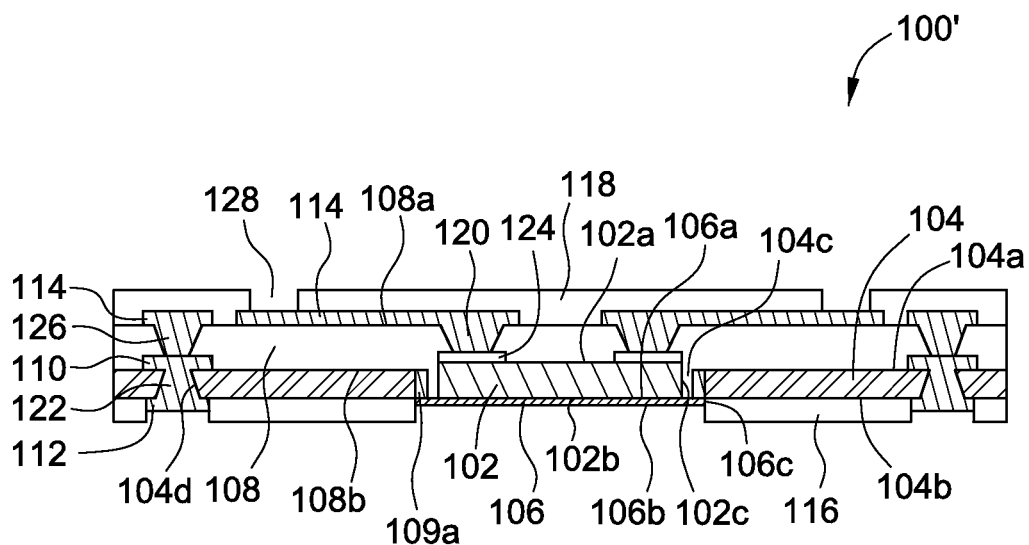
FIG. 1B is a cross-sectional view of an embedded component package structure according to an embodiment of the present disclosure.

FIG. 1B illustrates an embedded component package structure 100' similar to the embedded component package structure 100 in FIG. 1A, except that embedded component package structure includes a shielding layer formed on the side walls of the first through hole 104c of the substrate 104. The first metal layer 106 extends laterally to cover at least a portion of the shielding layer 109a; the first metal layer 106 and the shielding layer 109a thus form a shield around some, or all, of the side surfaces 102c and bottom surface 102b of the die 102. The shielding layer 109a may be, or may include, stainless steel, copper, nickel, iron, or an alloy or combination thereof. In one or more embodiments, the embedded component package structure 100' may include more than one die, each of which is surrounded with a respective shield including the shielding layer 109a and the metal layer 106.

Figure 2:
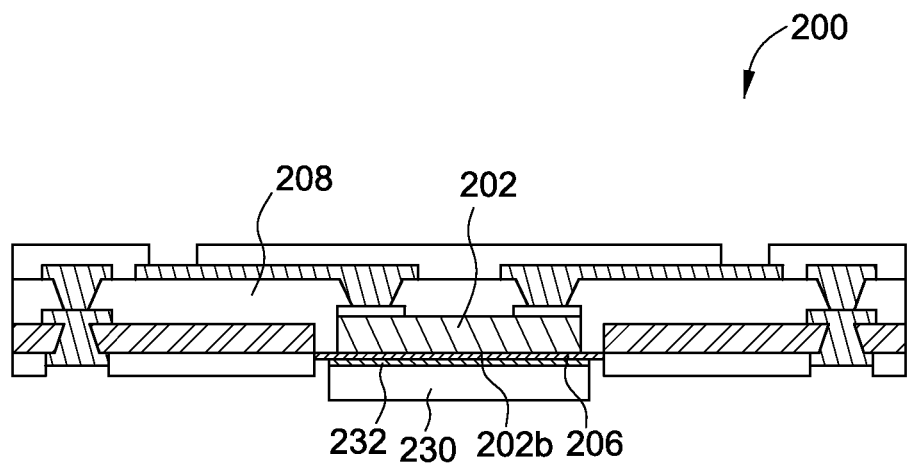
FIG. 2 is a cross-sectional view of an embedded component package structure according to an embodiment of the present disclosure.

FIG. 2 illustrates a cross-sectional view of an embedded component package structure 200 according to another embodiment of the present disclosure. The package structure 200 is similar to the package structure 100 of FIG. 1A, except that a first metal layer 206 covers all or a portion of a back surface 202b of a die 202, and a heat sink 230 is disposed on the first metal layer 206 to facilitate heat dissipation. In one or more embodiments, the heat sink 230 is attached to the first metal layer 206 by an adhesive layer 232. In one or more embodiments, the adhesive layer 232 is a thermally conductive adhesive, which may or may not include a thermally conductive silicone adhesive.

Figure 3A:
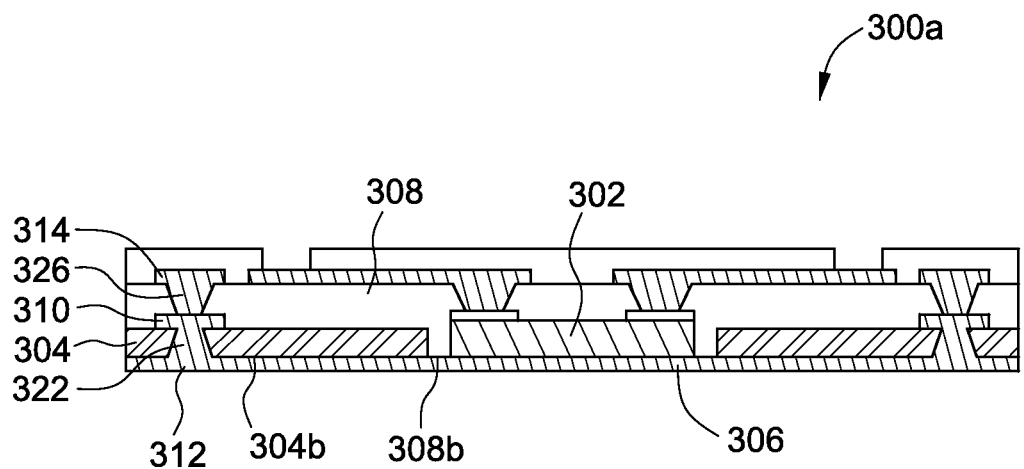
FIG. 3A is a cross-sectional view of an embedded component package structure according to an embodiment of the present disclosure.

FIG. 3A illustrates a cross-sectional view of an embedded component package structure 300a according to another embodiment of the present disclosure. The package structure 300a is similar to the package structure 100 of FIG. 1A, except that a first metal layer 306 covers a bottom surface of the embedded component package structure 300a, extending laterally along a back surface of a die 302, a lower surface 308b of a first dielectric layer 308, and a lower surface 304b of a substrate 304; and the first metal layer 306 extends to, and electrically connects to, a second patterned conductive layer 312. Consequently, heat generated by the die 302 may be dissipated through the first metal layer 306, the second patterned conductive layer 312, an interconnection 322, a first patterned conductive layer 310, an interconnection 326 and a third patterned conductive layer 314. In addition, because the first metal layer 306 electrically connects to the die 302 and to the first and third patterned conductive layers 310, 314, respectively, the first metal layer 306 may further be used to provide an electrical ground.

In one or more embodiments, the first metal layer 306 and the second patterned conductive layer 312 integrally cover the entirety of the bottom surface of the embedded component package structure 300a. In such embodiments, layer 312 can be viewed as a non-patterned layer.

Figure 3B:
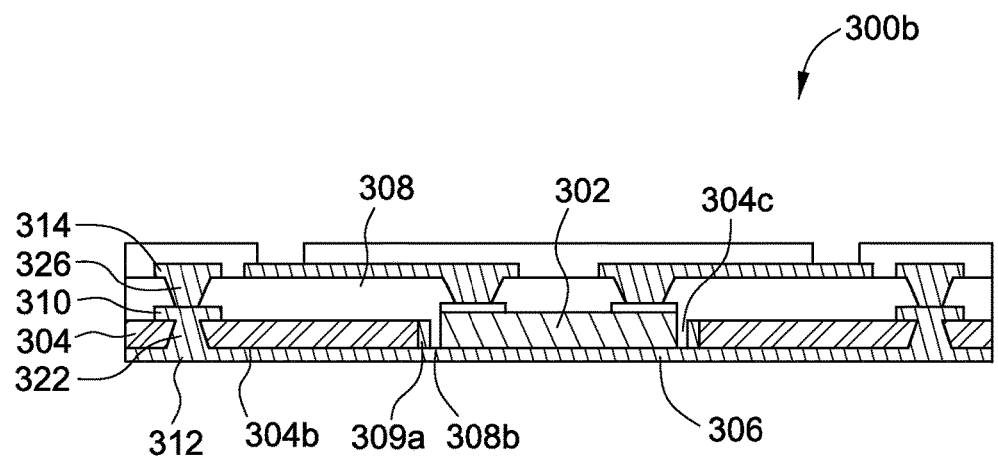
FIG. 3B is a cross-sectional view of an embedded component package structure according to an embodiment of the present disclosure.

FIG. 3B illustrates an embedded component package structure 300b, similar to the embedded component package structure 300a in FIG. 3A, except that the embedded component package structure 300b includes a shielding layer 309a formed on side walls of a first through hole 304c of a substrate 304 (similar to the shielding layer 109a in FIG. 1B). In such embodiments, the shielding layer 309a and the first metal layer 306 form a shield.

Figure 3C:
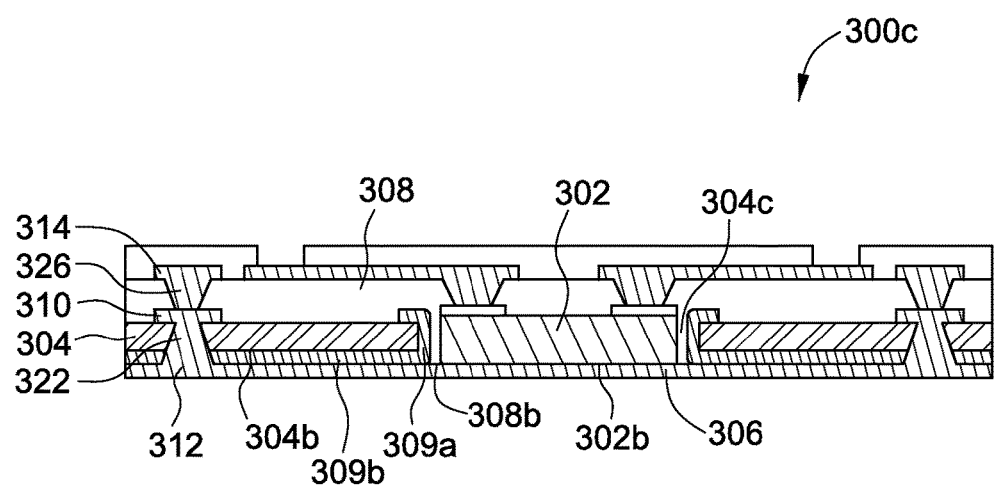
FIG. 3C is a cross-sectional view of an embedded component package structure according to an embodiment of the present disclosure.

FIG. 3C illustrates an embedded component package structure 300c, similar to the embedded component package structure 300b in FIG. 3B, except that a second metal layer 309b is located between the substrate 304 and the first metal layer 306 and covers the lower surface 304b of the substrate 304. A shielding layer 309a is formed on the side walls of the first through hole 304c of the substrate 304. As illustrated for the embodiment of FIG. 3C, the first patterned conductive layer 310 contacts the shielding layer 309a (as may also be the case similarly for other embodiments described herein). The first metal layer 306 together with the shielding layer 309a form a shield for the die 302. The first metal layer 306 extends laterally along the back surface of the die and the lower surface 308b of the first dielectric layer 308 and connects to the second patterned conductive layer 312. As shown in FIG. 3C, the back surface 302b of the die 302 where the die 302 is directly attached to the first metal layer 306 is lower (in the orientation shown) than the lower surface 304b of the substrate 304 on which the second metal layer 309b is disposed. The first metal layer 306 and the second patterned conductive layer 312 integrally cover the entire plane formed of the back surface 302b of the die 302, the lower surface 308b of the of the first dielectric layer 308, the second metal layer 309b on the lower surface 304b of the substrate 304, and the interconnection 322. In embodiments such as illustrated in FIG. 3C (and similarly FIGS. 3A and 3B), layer 312 can be viewed as a non-patterned layer. The second metal layer 309b may be, or may include, any suitable conductive material. For example, the second metal layer 309b may include a metal or metals, a metal alloy or alloys, a material with metal(s) or metal alloy(s) dispersed within, or a combination thereof. For example, the second metal layer 309b may include stainless steel, copper, nickel, iron or a combination thereof. A material of the second metal layer 309b may be the same as a material of one or more of the first patterned conductive layer 310, the third patterned conductive layer 314, or the interconnection 322, or may be different.

A second metal layer, similar to the second metal layer 309b in FIG. 3C, may be added to other embodiments that are in accordance with the present disclosure.

Figure 3D:
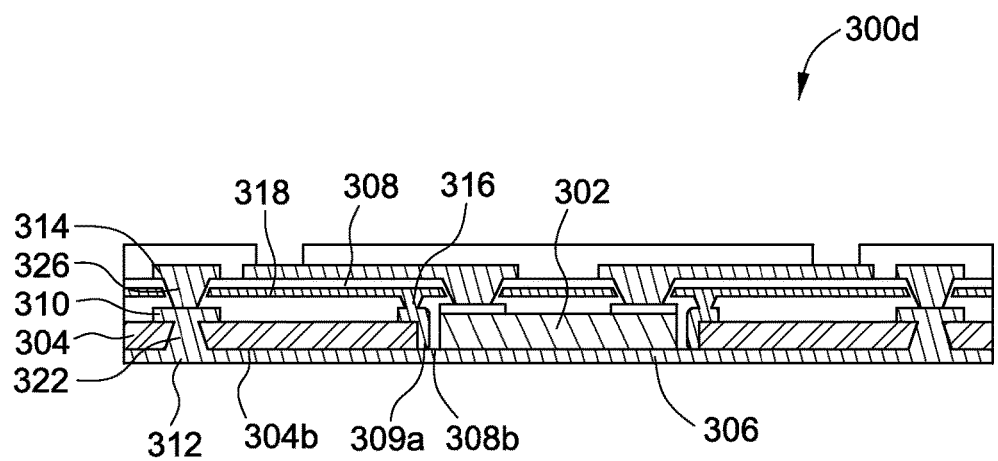
FIG. 3D is a cross-sectional view of an embedded component package structure according to an embodiment of the present disclosure.

FIG. 3D illustrates a cross-sectional view of an embedded component package structure 300d according to another embodiment of the present disclosure. The package structure 300d of FIG. 3D is similar to the package structure 300b of FIG. 3B, except that the shielding layer 309a covers a portion of the upper surface of the substrate 304, and a metal layer 318 is embedded in the first dielectric layer 308. The shielding layer 309a that covers that portion of the upper surface of the substrate 304 may be part of the first patterned conductive layer 310, as described with respect to FIG. 3C. The metal layer 318 may serve as a ground layer. The shielding layer 309a connects to the metal layer 318 via a conductive via 316, such that the shielding layer 309a together with the metal layer 318 provide an enhanced shielding effect.

Figure 3E:
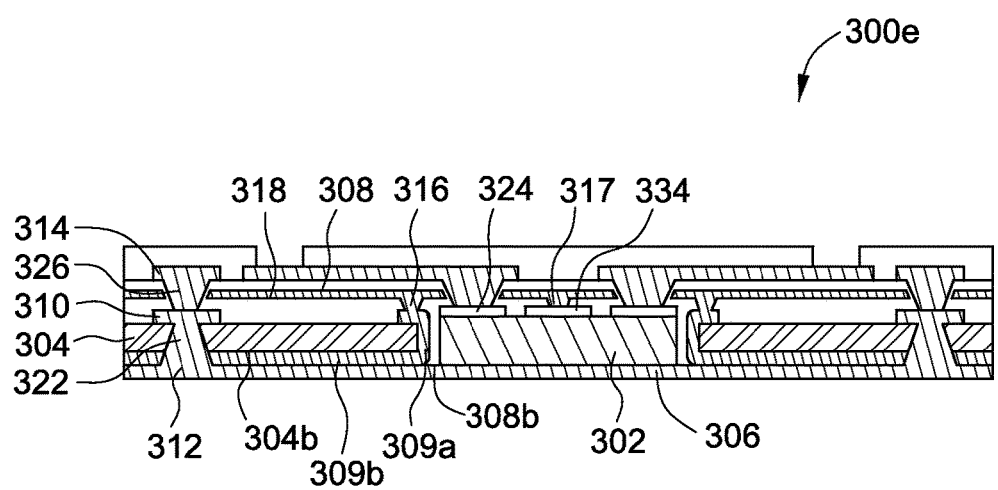
FIG. 3E is a cross-sectional view of an embedded component package structure according to an embodiment of the present disclosure.

FIG. 3E illustrates a cross-sectional view of an embedded component package structure 300e according to another embodiment of the present disclosure. The package structure 300e of FIG. 3E is similar to the package structure 300d of FIG. 3D except that, in addition to pads illustrated in FIG. 3D (and in FIGS. 3A-3C) such as pad 324, the die further includes a ground pad 334 that connects to the metal layer 318 through a conductive via 317, to provide a further shielding effect.

Figure 3F:
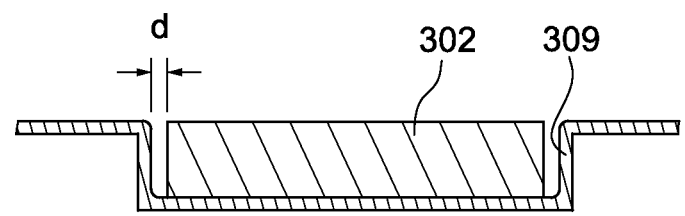
FIG. 3F illustrates a shielding structure surrounding a die.

In one or more embodiments, the shielding layer 309a has a first end curvedly tapering near the lower surface 304b of the substrate 304 (see FIGS. 3C, 3D and 3E); and in one or more embodiments, the shielding layer 309a has a second end curvedly tapering near the first surface 304a of the substrate 304 (see FIGS. 3C, 3D and 3E). FIG. 3F shows a structure of a shielding layer 309 according to one or more embodiments in which the shielding layer 309 is formed integrally by, for example, plating, and therefore, it has an arc-like shape at each corner. The shielding layer 309 extends under the die 302; and curvature at a lower corner of the shielding layer 309 may thus affect the leveling of the die. To improve positioning of the die 302, a distance d between the shielding layer 309 and the die 302 is provided. However, such a space may add to a size of a corresponding embedded component package structure. In the embodiments shown in FIGS. 3C, 3D and 3E, the shielding layer 309a/309b extends away from the die 102, rather than extending toward the die 302; therefore, in such embodiments, the shielding layer 309a/309b would not occupy additional horizontal space as compared to the shielding layer 309 illustrated in FIG. 3F. Thus, a size of the corresponding embedded component package structure may be reduced. In addition, in the embodiments shown in FIGS. 3B, 3C, 3D and 3E, because the die can be placed on a relatively flat surface (e.g., without an unleveling influence of a shielding layer), subsequent processing such as laser drilling can be performed more accurately.

Figure 4:
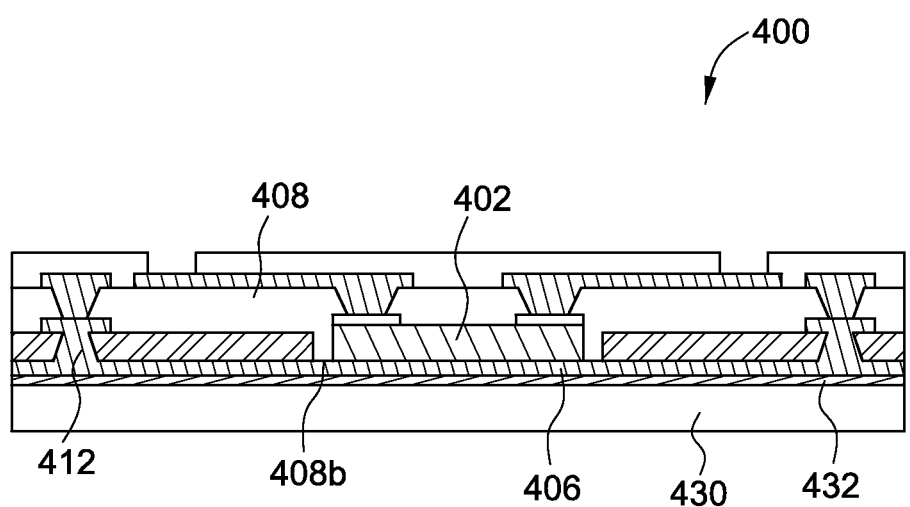
FIG. 4 is a cross-sectional view of an embedded component package structure according to an embodiment of the present disclosure.

FIG. 4 illustrates a cross-sectional view of an embedded component package structure 400 according to another embodiment of the present disclosure. The package structure 400 is similar to the package structure 300a of FIG. 3A, except that a heat sink 430 is disposed on a first metal layer 406 by way of an adhesive layer 432. The heat sink 430 may be, or may include, a thermally conductive material; for example, the heats sink 430 may be a metal, a metal alloy, a material including a metal or metal alloy dispersed therein.

In one or more embodiments, the heat sink 430 is, or includes, copper or aluminum. In one or more embodiments, the heat sink 430 is, or includes, a graphene, carbon nanotubes, thermally conductive plastics, or a combination thereof. In one or more embodiments, the adhesive layer 432 is a thermally conductive adhesive (such as a thermal conductive silicone adhesive or a non-silicone type thermal conductive silicone adhesive). The heat sink 430 provides for additional heat dissipation.

Figure 5:
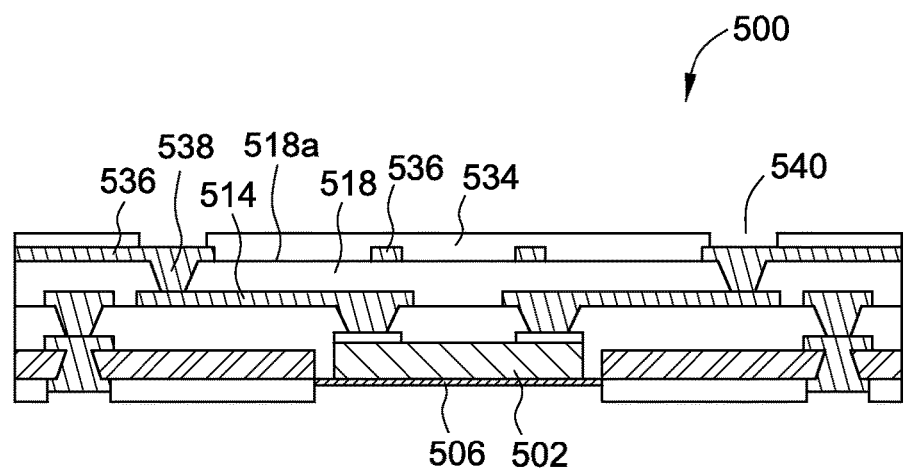
FIG. 5 is a cross-sectional view of an embedded component package structure according to an embodiment of the present disclosure.

FIG. 5 illustrates a cross-sectional view of an embedded component package structure 500 according to another embodiment of the present disclosure. The package structure 500 is similar to the package structure 100 of FIG. 1A, except that the embedded component package structure 500 further includes a fourth patterned conductive layer 536 disposed on a top surface 518a of a second dielectric layer 518. The fourth patterned conductive layer 536 electrically connects to a third patterned conductive layer 514 through an electrical interconnection 538. In addition, a third dielectric layer 534 may be disposed on the second dielectric layer 518 and the fourth patterned conductive layer 536. The third dielectric layer 534 defines openings 540 which expose a portion of the fourth patterned conductive layer 536 for external electrical connection. Although FIG. 5 illustrates one additional circuit layer over FIG. 1A (i.e., the fourth patterned conductive layer 536), it should be noted that the present disclosure may be further applied to a configuration of further additional circuit layers, with corresponding further dielectric layers and interconnections. Such patterned conductive layers, electrical interconnections and dielectric layers (as well the patterned conductive layers, electrical interconnections and dielectric layers illustrated in FIG. 5) can be of similar materials to those described with respect to FIG. 1A.

Figure 6:
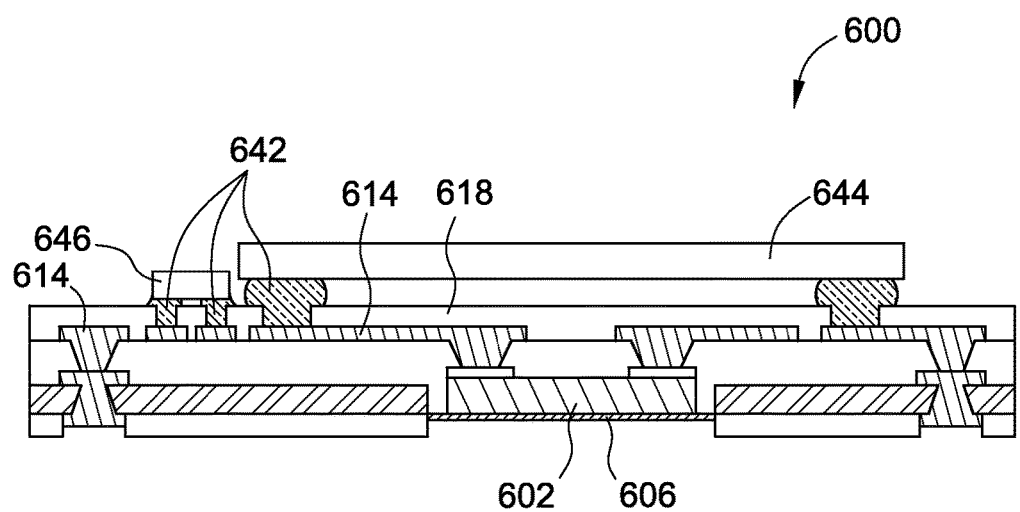
FIG. 6 is a cross-sectional view of an embedded component package structure according to an embodiment of the present disclosure.

FIG. 6 illustrates a cross-sectional view of an embedded component package structure 600 according to another embodiment of the present disclosure. The package structure 600 is similar to the package structure 100 of FIG. 1A, except that portions of a third patterned conductive layer 614 exposed in respective openings defined by a second dielectric layer 618 are used as external electrical contacts, and a solder or solder balls 642 fill the openings defined by the second dielectric layer 618, and electrically connect the third patterned conductive layer 614 to an active component 644 and a passive component 646, thereby providing a system package.

Figure 7:
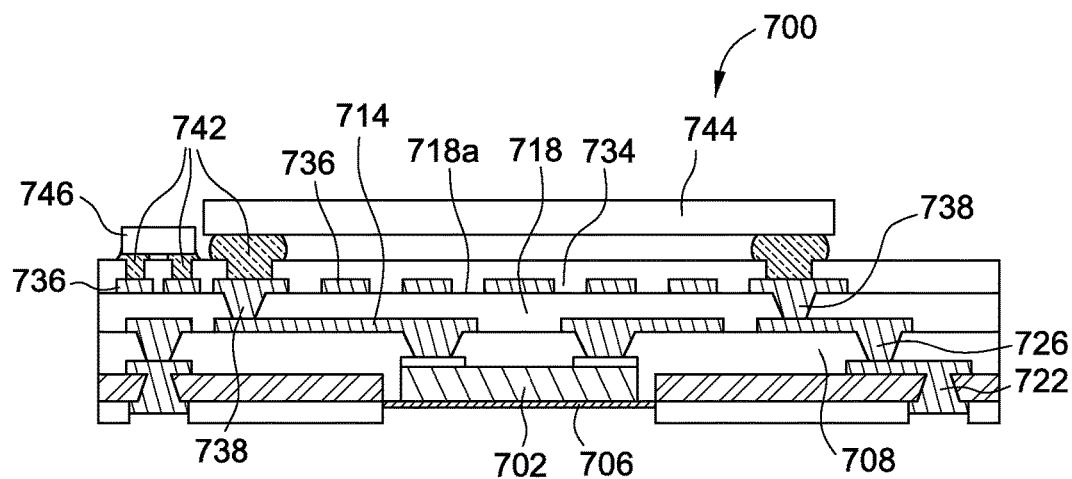
FIG. 7 is a cross-sectional view of an embedded component package structure according to an embodiment of the present disclosure.

FIG. 7 illustrates a cross-sectional view of an embedded component package structure 700 according to another embodiment of the present disclosure. The package structure 700 is similar to the package structure 500 of FIG. 5, except that portions of a fourth patterned conductive layer 736 exposed in respective openings defined by a third dielectric layer 734 are used as external electrical contacts, and a solder or solder balls 742 fill the openings defined by the third dielectric layer 734, and electrically connect to an active component 744 and a passive component 746, thereby providing a system package. As shown in FIG. 7, the active component 744 may electrically connect to the die 702 through the solder balls 742 and the electrical interconnections 738. In addition, the active component 744 may also electrically connect to external circuitry through the solder balls 742 and the electrical interconnections 722, 726 and 738. As shown in FIG. 7, electrical interconnections such as electrical interconnections 722, 726 and 738 may be staggered, and can be arranged to form a fan-out structure.

Figure 8:
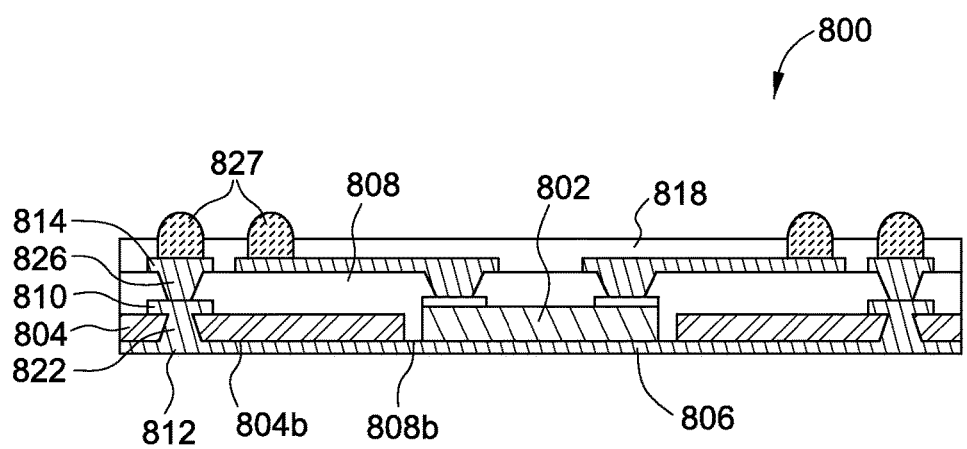
FIG. 8 is a cross-sectional view of an embedded component package structure according to an embodiment of the present disclosure.

FIG. 8 illustrates a cross-sectional view of an embedded component package structure 800 according to another embodiment of the present disclosure. The package structure 800 is similar to the package structure 300*a* of FIG. 3A, except that portions of a third patterned conductive layer 814 exposed in respective openings defined by a second dielectric layer 818 are used as external electrical contacts, and a solder or solder balls 827 fill the openings defined by the second dielectric layer 818, thereby providing electrical connections to external circuitry.

Although the aspects of the present disclosure are described with reference to the above embodiments and drawings, the technical features described in the embodiments and drawings may be combined with each other. For example, the package structures 200, 300*a*, 400, 500, 600, 700 and 800 of FIGS. 2, 3A, 4, 5, 6 and 8 may contain a shielding layer (for example, similar to shielding layer 109*a* in FIG. 1B or the shielding layer 309*a* in FIGS. 3C, 3D and 3E) formed on side walls of a through hole defined by the substrate.

FIGS. 9A-9M illustrate methods for manufacturing embedded component package structures according to an embodiment of the present disclosure. The methods may also be used to form a plurality of semiconductor packages on a substrate, and each semiconductor package may have a structure corresponding to one of the embodiments in FIGS. 1-8. FIGS. 9A-9D illustrate an embodiment of a method according to the present disclosure. FIG. 9E illustrates an embodiment of a method according to the present disclosure. FIG. 9F illustrates an embodiment of a method according to the present disclosure. FIG. 9G illustrates an embodiment of a method according to the present disclosure. An embodiment of a method according to the present disclosure is illustrated by FIG. 9H. An embodiment of a method according to the present disclosure is illustrated by FIG. 9I. An embodiment of a method according to the present disclosure is illustrated by FIG. 9J. An embodiment of a method according to the present disclosure is illustrated by FIG. 9K. An embodiment of a method according to the present disclosure is illustrated by FIGS. 9L and 9M.

Figure 9A:
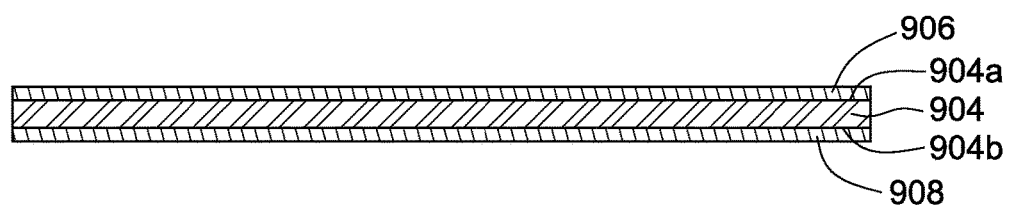
FIGS. 9A, 9B, 9C, 9D, 9E, 9F, 9G, 9H, 9I, 9J, 9K, 9L and 9M illustrate methods for manufacturing an embedded component package structure according to embodiments of the present disclosure. Particularly, a method is illustrated in FIGS. 9A-9D, a method is illustrated in each of FIGS. 9E, 9F, 9G, 9H, 9I, 9J and 9K, and a method is illustrated in FIGS. 9L-9M.

Referring to FIG. 9A, a substrate 904 is provided. In one or more embodiments, the substrate 904 includes a first conductive foil 906 on a first surface 904*a* of the substrate 904 and a second conductive foil 908 on a second surface 904*b* of the substrate 904. In one or more embodiments, the first conductive foil 906 and the second conductive foil 908 may be formed on the respective surfaces of the substrate 904 by means of lamination in the case in which the original substrate 904 does not have a conductive foil on its surfaces.

Figure 9B:
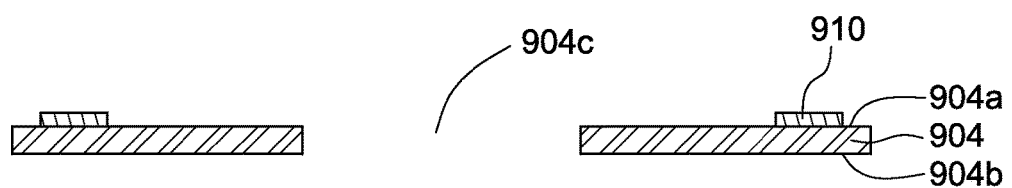

Referring to FIG. 9B, a first through hole 904*c* extending from the first surface 904*a* to the second surface 904*b* (or additionally through the first conductive foil 906 and the second conductive foil 908) is formed in the substrate 904. The first through hole 904*c* is used to receive die(s), and thus a width and a shape of the first through hole 904*c* is determined in accordance with the die(s). For example, a width of the first through hole 904*c* is greater than a width of a die that is to be positioned within the first through hole 904*c*. The first through hole 904*c* may be formed by various methods. For example, the first through hole may be formed by laser drilling, mechanical drilling or other suitable technique; or by any other suitable burrowing method. For example, the first through hole may be formed by milling, routing, laser drilling or punching. In one embodiment, the first through hole 904*c* is formed by punching. The first through hole 904*c* may have any shape, including but not limited to a columnar shape or a non-columnar shape. Columnar shape can be, for example, a cylindrical shape, an elliptic columnar shape, a square columnar shape, or a rectangular columnar shape; non-columnar shape can be, for example, a conical shape, a funnel-like shape, or other. Sidewalls of the first through hole 904*c* may have a curved shape, such as an arc shape. The sidewalls of the first through hole 904*c* may be have a texture. In one or more embodiments, the first through hole 904*c* is formed so that a portion of a sidewall of the first through hole 904*c* closest to a bottom of the first through hole 904*c* is farther from the position where the die will be placed than a portion of the sidewall of the first through hole 904*c* closest to a top of the first through hole 904*c*. In addition, the first conductive foil 906 is patterned to form a first patterned conductive layer 910, and the second conductive foil 908 is removed to expose the second surface 904*b* of the substrate 904. The patterning can be achieved by lithography or etching. In one embodiment, a shielding layer (not shown) may be formed on the side walls of the first through hole 904 by sputtering or plating techniques, such as electroless plating and/or electroplating. The shielding layer may be formed before or after (or during) the formation of the first patterned conductive layer and the second patterned conductive layer.

Figure 9C:
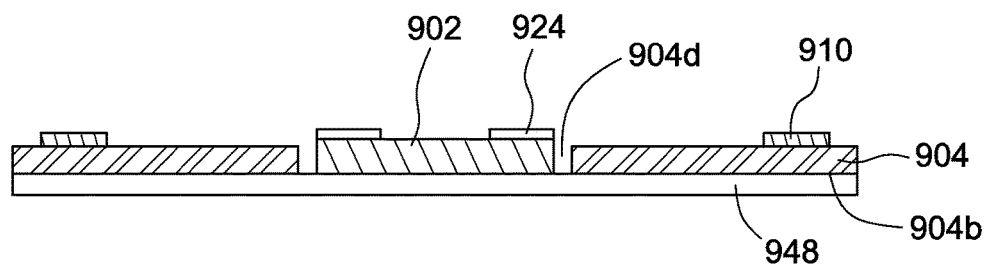

Referring to FIG. 9C, an adhesive film 948 is provided on the second surface 904*b* of the substrate 904 and covers all, or a portion of, the first through hole 904*c*. A die 902 is attached to the adhesive film 948 in the first through hole 904*c* due to the stickiness of the adhesive film 948. The die 902 includes pads 924, and a periphery of the die 902, together with the side walls of the first through hole 904*c*, forms a space 904*d*.

Figure 9D:
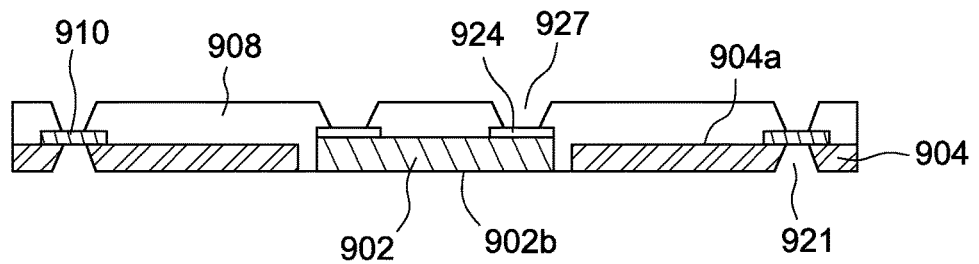
Figure 9E:
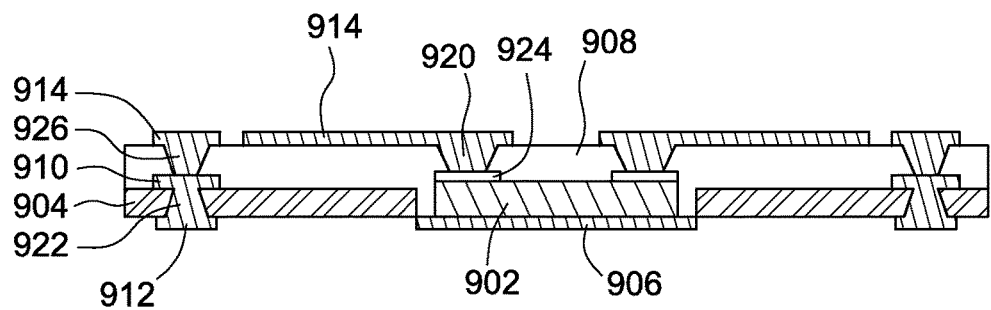
Figure 9F:
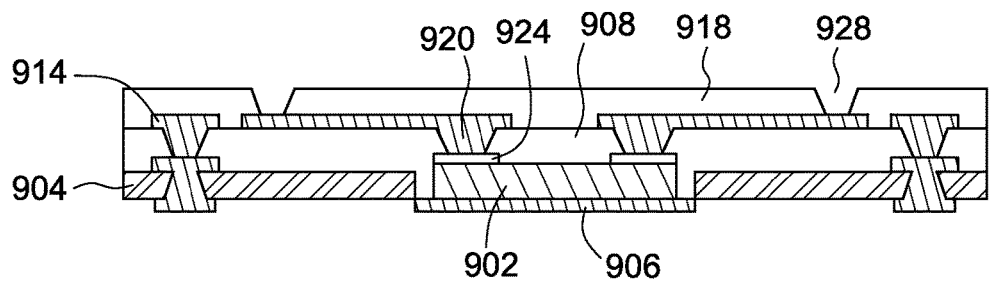
Figure 9G:
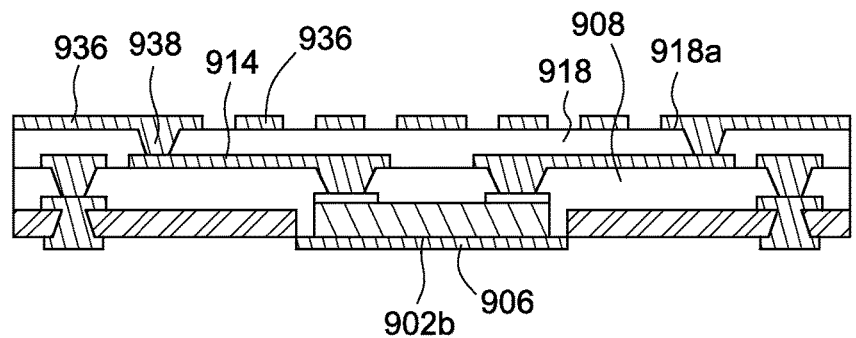
Figure 9H:
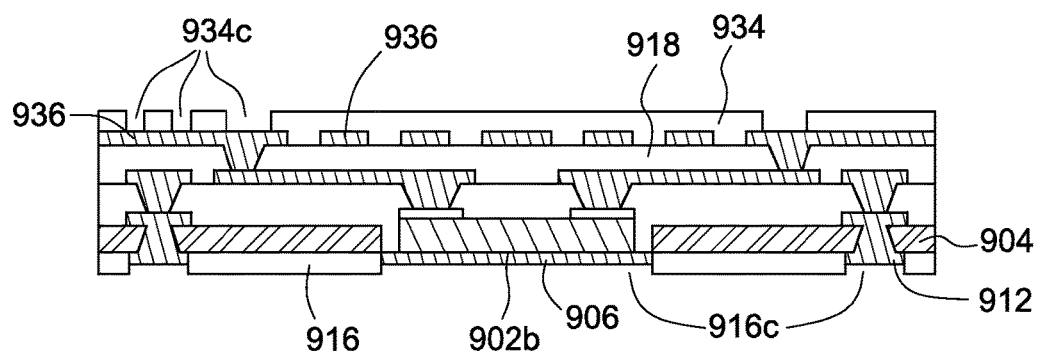
Figure 9I:
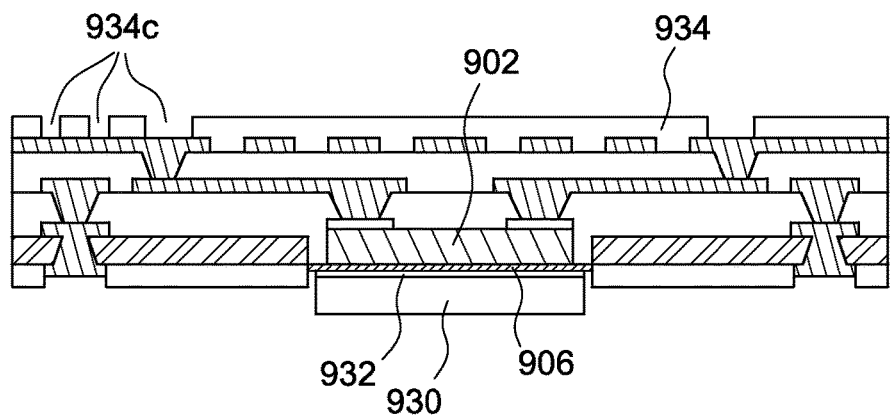
Figure 9J:
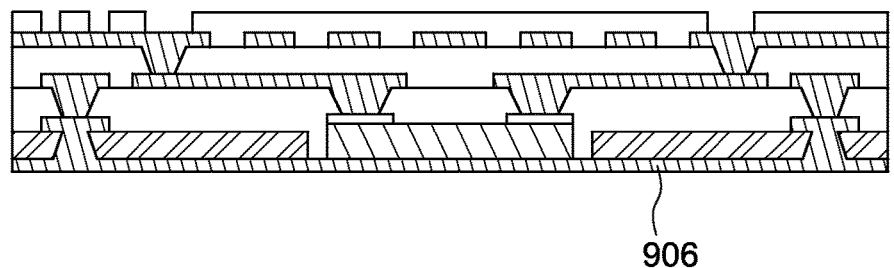
Figure 9K:
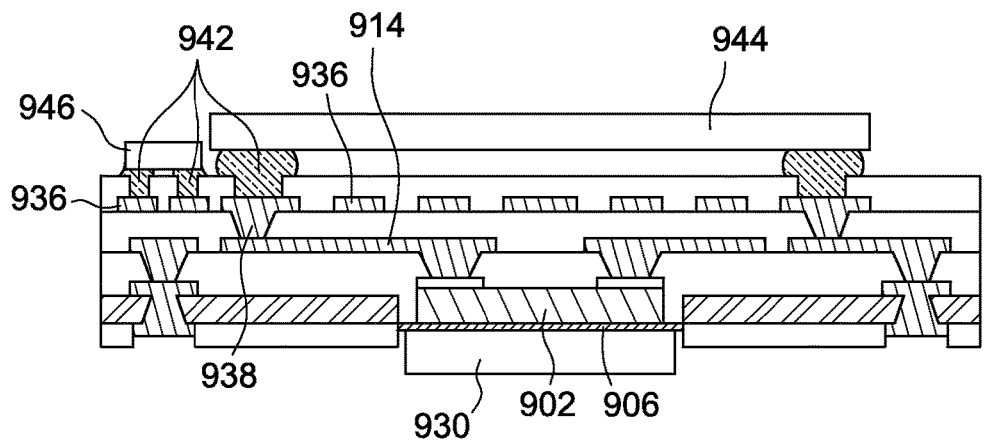
Figure 9L:
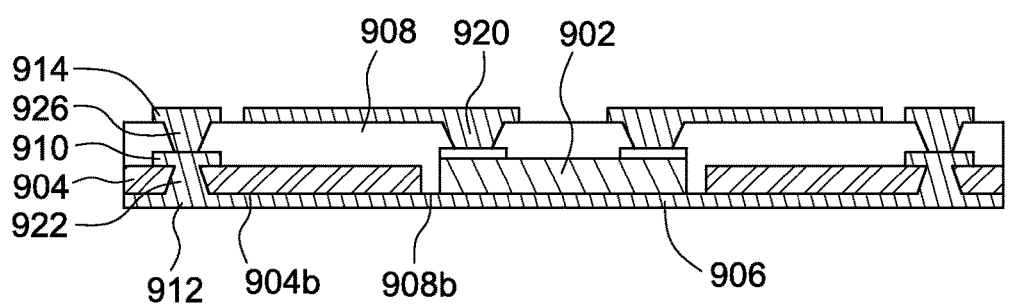
Figure 9M:
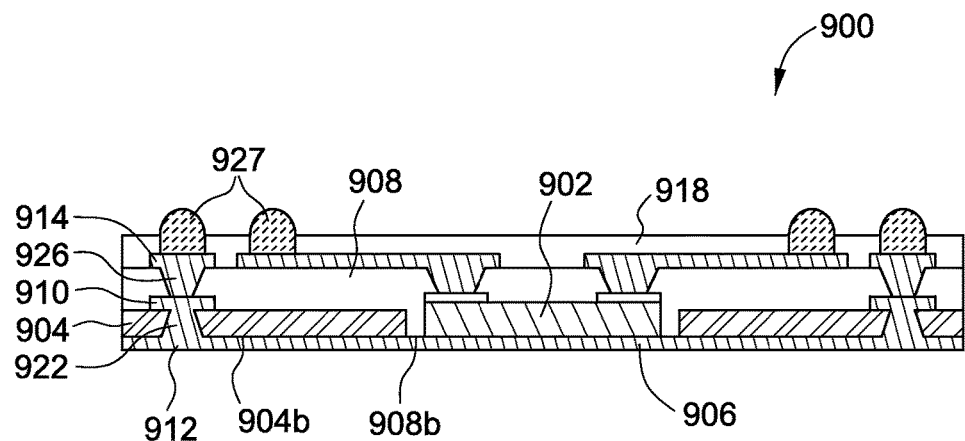

Referring to FIG. 9D, a first dielectric layer 908 is disposed on the first surface 904*a* of the substrate 904, and covers the die 902. The first dielectric layer 908 may substantially fill the space 904*d* between the periphery of the die 902 and the sidewalls of the first through hole 904*c*. In one or more embodiments, the first dielectric layer 908 may be disposed on the first surface 904*a* of the substrate 904 by means of lamination. In other embodiments, the first dielectric layer 908 may be formed by any coating techniques, such as printing, spin coating, or spraying. In one or more embodiments, the first dielectric layer 908 is formed from prepreg materials. A second through hole 927, or multiple second through holes 927, is formed in the first dielectric layer 908 to expose the pad 924 of the die 902 and/or to expose a portion of the first patterned conductive layer 910. The second through hole 927 may be formed by any suitable methods. For example, the second through hole 927 may be formed by lithography/etching, laser drilling, mechanical drilling or other suitable technique. In one or more embodiments, the second through hole 927 is formed by laser drilling. The second through hole 927 may have any shape, including but not limited to a columnar shape or a non-columnar shape. Columnar shape can be, for example, a cylindrical shape, an elliptic columnar shape, a square columnar shape, or a rectangular columnar shape; non-columnar shape can be, for example, a conical shape, a funnel-like shape, or other. Sidewalls of the second through hole 927 may have a curved shape. As shown in FIG. 9D, the adhesive film 948 is removed after the formation of the first dielectric layer 908, because the first dielectric layer 908 has stickiness and may facilitate securing the die 902 in the first through hole 904*c* of the substrate 904.

Furthermore, as shown in FIG. 9D a third through hole 921, or multiple through holes 921 is formed in the substrate 904, extending from the second surface 904*b* to the first surface 904*a* to expose the first patterned conductive layer 910. The third through hole 921 may be formed by any suitable methods. For example, the third through hole 921 may be formed by lithography/etching, laser drilling, mechanical drilling or other suitable technique. In one or more embodiments, the third through hole 921 is formed by laser drilling. In one or more embodiments, the third through holes 921 is staggered with respect to the second through hole 927. The third through hole 921 may have any shape, including but not limited to a columnar shape or a non-columnar shape. Columnar shape can be, for example, a cylindrical shape, an elliptic columnar shape, a square columnar shape, or a rectangular columnar shape; non-columnar shape can be, for example, a conical shape, a funnel-like shape, or other. In one or more embodiments, when the third through hole 921 is formed by laser drilling the second surface 904b of the substrate 904, an area of the first surface 904a exposed by the third through hole 921 is smaller than an area of the second surface 904b exposed by the third through hole 921. Furthermore, because the second through hole 927 and the third through hole 921 are drilled from a direction opposite to each other, the stress may be reduced as compared to a case in which the second through hole 927 and the third through hole 921 are drilled from the same direction.

FIGS. 9A-9D describe an embodiment of a method according to the present disclosure.

FIG. 9E illustrates another embodiment of a method according to the present disclosure, and is performed subsequently to the method illustrated in FIGS. 9A-9D. Referring to FIG. 9E, electrical interconnections 920, 922 and 926 are formed by filling respective through holes with conductive materials. The electrical interconnections 920, 922 and 926 may be formed by any plating techniques, such as electroless plating and/or electroplating. As shown in FIG. 9E, a third patterned conductive layer 914 is formed on a surface of the first dielectric layer 908, and a second patterned conductive layer 912 is formed on the second surface 904b of the substrate 904. The third patterned conductive layer 914 may include at least one pad and at least one trace, both of which can be formed in a same process. In addition, a first metal layer 906 is formed on a back surface 902b of the die 902. The first metal layer 906 may be formed by electroless plating or electroplating. The third patterned conductive layer 914 may be formed by using the same techniques as those adopted for the first and second patterned conductive layers 910, 912, respectively. In one or more embodiments, the first metal layer 906 and the second patterned conductive layer 912 are formed in the same process, such as by electroplating.

FIG. 9F illustrates another embodiment of a method according to the present disclosure and is performed subsequently to the method illustrated in FIG. 9E. Referring to FIG. 9F, a second dielectric layer 918 is formed on the first dielectric layer 908 and the third patterned conductive layer 914. As shown in FIG. 9F, a through hole 928, or multiple through holes 928, are formed in the second dielectric layer 918 to expose a portion of the third patterned conductive layer 914 for external electrical connection. The exposed portion of the third patterned conductive layer 914 may be pads. The through holes 928 may be formed by using the same techniques as those adopted for the through holes 921, 927 of FIG. 9D.

FIG. 9G illustrates another embodiment of a method according to the present disclosure and is performed subsequently to the method illustrated in FIG. 9F. Referring to FIG. 9G, a second dielectric layer 918 is provided on the first dielectric layer 908 and the third patterned conductive layer 914, and fills the openings 928 defined by the third patterned conductive layer 914. The second dielectric layer 918 may be formed by using the same means as those adopted for the first dielectric layer 908. Electrical interconnections 938 are formed by filling the through holes 928 exposing the third patterned conductive layer 914 with conductive materials. The electrical interconnections 938 may be formed by using the same techniques as those adopted for the electrical interconnections 920 of FIG. 9E. As shown in FIG. 9G, a fourth patterned conductive layer 936 is formed on an upper surface 918a of the second dielectric layer 918. The fourth patterned conductive layer 936 electrically connects to the third patterned conductive layer 914 through the electrical interconnections 938. The fourth patterned conductive layer 936 may be formed by using the same techniques as those adopted for the third patterned conductive layer 914. The fourth patterned conductive layer 936 may include at least one pad and at least one trace, both of which can be formed in the same process.

FIG. 9H illustrates another embodiment of a method according to the present disclosure and is performed subsequently to the method illustrated in FIG. 9G. Referring to FIG. 9H, a third dielectric layer 934 is provided on the second dielectric layer 918 and the fourth patterned conductive layer 936. An opening 934c, or multiple openings 934c, are formed in the third dielectric layer 934 to expose a portion of the fourth patterned conductive layer 936 for external electrical connection. For example, the exposed portion can be ball pads on which solder balls of a ball grid array may be formed, or can be pads which connect other components with wires. The opening 934c may be formed by using the same techniques as those adopted for the through holes 921, 927 of FIG. 9D. The third dielectric layer 934 may be a solder mask (or solder resist) layer. For example, the third dielectric layer 934 may be a solder mask layer formed of photosensitive dry films or may be formed with other patternable materials, such as polyimide, though not limited thereto.

In addition, a solder mask layer 916 is provided on the second surface 904b of the substrate 904. The solder mask 916 may be formed by using the same techniques as those adopted for the dielectric layers. An opening 916c, or multiple openings 916c, are formed in the solder mask layer 916 to expose a portion of the second patterned conductive layer 912, for providing external electrical connection. The solder mask layer 916 may be formed of photosensitive dry films or other patternable materials, for example, polyimide, though not limited thereto. The openings 916c may be formed by lithography/etching, laser drilling, mechanical drilling or other suitable technique.

FIG. 9I illustrates another embodiment of a method according to the present disclosure and is performed subsequently to the method illustrated in FIG. 9H. Referring to FIG. 9I, a heat sink 930 is provided on the first metal layer 906. The heat sink 930 may attach to the first metal layer 906 by adhesive layer 932. In one or more embodiments, the adhesive layer 932 is a thermally conductive adhesive (such as a thermal conductive silicone adhesive or a non-silicone type thermal conductive silicone adhesive) and is coated on the surface of first metal layer 906.

FIG. 9J illustrates another embodiment of a method according to the present disclosure and is similar to the method illustrated for FIG. 9H, except that, instead of forming the first metal layer 906 on the back surface 902b of the die 902 (for example, as shown in FIGS. 9E-9H) the first metal layer 906 is formed to cover the back surface 902b of the die 902 and further extends along the surface 908b of the first dielectric layer 908 and the second surface 904a of the substrate 904 to the second patterned conductive layer 912. The first metal layer 906 can be formed by electroplating or electroless plating. In one or more embodiments, the first metal layer 906 is a copper layer formed by electroplating. In one or more embodiments, the first metal layer 906 and the second patterned conductive layer 912 may be formed in the same plating process. In the embodiment of FIG. 9J, the first metal layer 906 can be formed at a manufacturing stage subsequent to removal of the adhesive film 948 as illustrated in FIG. 9D.

FIG. 9K illustrates another embodiment of a method according to the present disclosure and is performed subsequently to the method illustrated in FIG. 9I. Referring to FIG. 9K, electrical interconnections 942 are formed by filling the openings 934*c* (defined by the third dielectric layer 934) with conductive materials. The electrical interconnections 942 may be formed by any suitable techniques, such as soldering. For example, the electrical interconnections 942 may be solder or solder balls and electrically connect to an active component 944 and a passive component 946.

FIGS. 9L-9M illustrate another embodiment of a method according to the present disclosure and is performed subsequently to the method illustrated in FIG. 9D. Referring to FIG. 9L, electrical interconnections 920, 922 and 926 may be formed by filling respective through holes with conductive materials. The electrical interconnections 920, 922 and 926 may be formed by any plating techniques, such as electroless plating and/or electroplating. As shown in FIG. 9L, a third patterned conductive layer 914 is formed on a surface of the first dielectric layer 908, and a second patterned conductive layer 912 is formed on the second surface 904*b* of the substrate 904. The third patterned conductive layer 914 may include at least one pad and at least one trace, both of which may be formed in the same process. In addition, a first metal layer 906 is formed on the back surface 902*b* of the die 902. The first metal layer 906 may be formed to cover all, or a portion of, the back surface 902*b*, and may extend along the surface 908*b* of the first dielectric layer 908 and the second surface 904*a* of the substrate 904 to the second patterned conductive layer 912. The first metal layer 906 can be formed by electroplating or electroless plating. The third patterned conductive layer 914 may be formed by using the same techniques as those adopted for the first and second patterned conductive layers 910, 912, respectively. In one or more embodiments, the first metal layer 906 and the second patterned conductive layer 912 are formed in the same process, such as by electroplating.

Referring to FIG. 9M, a second dielectric layer 918 is provided on the first dielectric layer 908 and the third patterned conductive layer 914. The second dielectric layer 918 may be formed by using the same techniques as those adopted for the first dielectric layer 908. As shown in FIG. 9M, the second dielectric layer 918 may include one or more through holes to expose a portion of the third patterned conductive layer 914 for external electrical connection. Solder or solder balls 927 may be filled into the openings defined by the second dielectric layer 918 to provide external electrical connection. The exposed portion of the third patterned conductive layer 914 may include pads. The through holes may be formed by lithography/etching, laser drilling or other suitable techniques. In one embodiment, the through holes are formed by laser drilling.

From the above, it can be known that in the embodiments of the method for manufacturing an embedded component package structure according to the present disclosure, electrical circuits with interconnections are first formed on the upper surface and the lower surface of the substrate, and then a die is disposed within the substrate and a heat dissipating mechanism is formed. This may avoid the problems that occur when the die is disposed within the substrate and the heat dissipating mechanism is formed before the formation of electrical circuits with interconnections on the upper surface and the lower surface of the substrate. For example, if the yield of establishing electrical circuits with interconnections on the upper surface and the lower surface of the substrate is poor, die waste may be avoided because the die has not been disposed within the substrate yet.

FIGS. 10A-10I illustrate a method for manufacturing an embedded component package structure according to another embodiment of the present disclosure. The method for manufacturing a semiconductor package described below may also be used to form a plurality of semiconductor packages on a substrate.

Figure 10A:
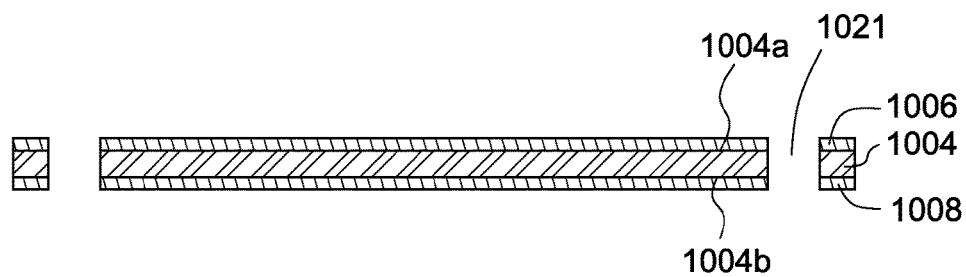
FIGS. 10A, 10B, 10C, 10D, 10E, 10F, 10G, 10H and 10I illustrate a method for manufacturing an embedded component package structure according to an embodiment of the present disclosure.

Referring to FIG. 10A, a substrate 1004 is provided. In one embodiment, the substrate 1004 includes a first conductive foil 1006 on the first surface 1004*a* and a second conductive foil 1008 on the second surface 1004*b*. In another embodiment, the first conductive foil 1006 and the second conductive foil 1008 may be formed on the surface of the substrate 1004 by lamination if the original substrate 1004 does not have a conductive foil on its surfaces. As shown in FIG. 10A, through holes 1021 extending from the first surface 1004*a* to the second surface 1004*b* (or also through the first conductive foil 1006 and the second conductive foil 1008) are formed in the substrate 1004. The through holes 1021 may be formed by any suitable methods. For example, the through holes 1021 may be formed by laser drilling, mechanical drilling or other suitable techniques or by any suitable burrowing methods. In one embodiment, the through holes 1021 are formed by mechanical drilling. The through holes 1021 may have any shape, including but not limited to a columnar shape or a non-columnar shape. Columnar shape can be, for example, a cylindrical shape, an elliptic columnar shape, a square columnar shape, or a rectangular columnar shape; non-columnar shape can be, for example, a conical shape, a funnel-like shape, or other. Sidewalls of the through holes 1021 may have a curved shape. The sidewalls of the through holes 1021 may have an arc shape. The sidewalls of the through holes 1021 may have a texture.

Figure 10B:
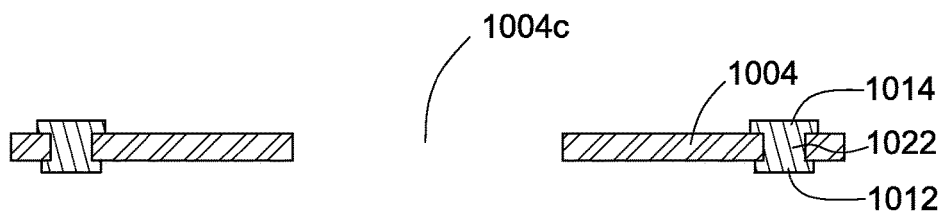

Referring to FIG. 10B, the first patterned conductive layer 1014 is formed by patterning the first conductive foil 1006, and the second patterned conductive layer 1012 is formed by patterning the second conductive foil 1008. The patterning can be achieved by lithography or etching. Subsequently, a through hole 1004*c* extending from the first surface 1004*a* to the second surface 1004*b* is formed in the substrate 1004. The through hole 1004*c* is used to receive the die(s), and thus a width and a shape of the through hole 1004*c* is determined in accordance with the die(s). The through hole 1004*c* may be formed by the techniques described above. In one embodiment, a shielding layer (not shown) may be formed on the side walls of the through hole 1004*c* by sputtering or any plating techniques, such as electroless plating and/or electroplating. The shielding layer may be formed before or after, or during, the formation of the first patterned conductive layer 1014 the second patterned conductive layer 1012. In addition, electrical interconnections 1022 may be formed by filling the through holes 1021 with conductive materials. The electrical interconnections 1022 may be formed by any plating techniques, such as electroless plating and/or electroplating.

Figure 10C:
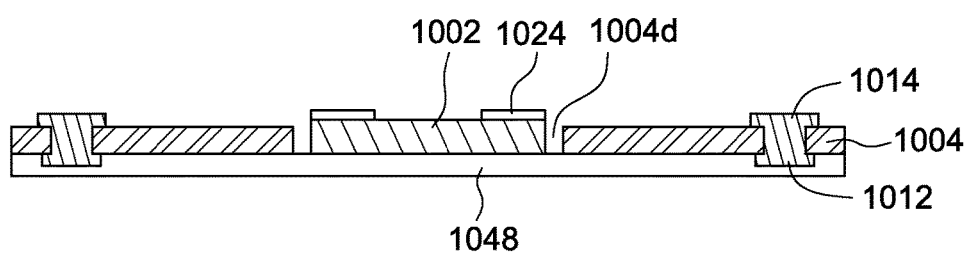

Referring to FIG. 10C, an adhesive film 1048 is provided on a surface of the substrate 1004 and covers the through hole 1004c or a part of the through hole 1004c. A die 1002 is attached to the adhesive film 1048 in the through hole 1004c The die 1002 includes pads 1024, and a periphery of the die 1002 together with the sidewalls of the through hole 1004c forms a space 1004d.

Figure 10D:
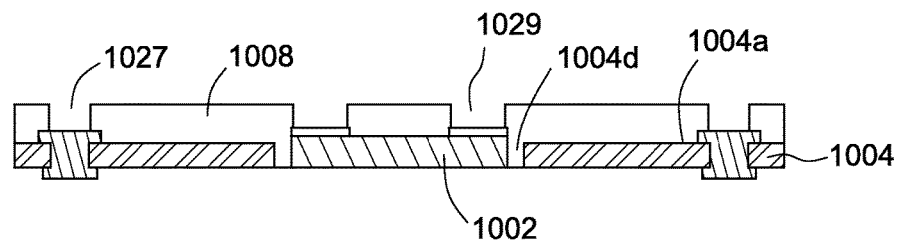

Referring to FIG. 10D, a first dielectric layer 1008 is formed on the first surface 1004a of the substrate 1004 and covers the die 1002. The first dielectric layer 1008 may substantially fill the space 1004d between the periphery of the die 1002 and the sidewalls of the through hole 1004c. In one or more embodiments, the first dielectric layer 1008 may be disposed on the first surface 1004a of the substrate 1004 by the techniques as described above. The first dielectric layer 1008 defines at least one through hole 1029 to expose pads 1024 of the die 1002, and at least one through hole 1027 to expose portions of the first patterned conductive layer 1014. The through holes 1027, 1029 may be formed by the techniques described above. As shown in FIG. 10D, the adhesive film 1048 can be removed after the formation of the first dielectric layer 1008 because the first dielectric layer 1008 has stickiness and may facilitate securing the die 1002 in the through hole 1004c of the substrate 1004.

Figure 10E:
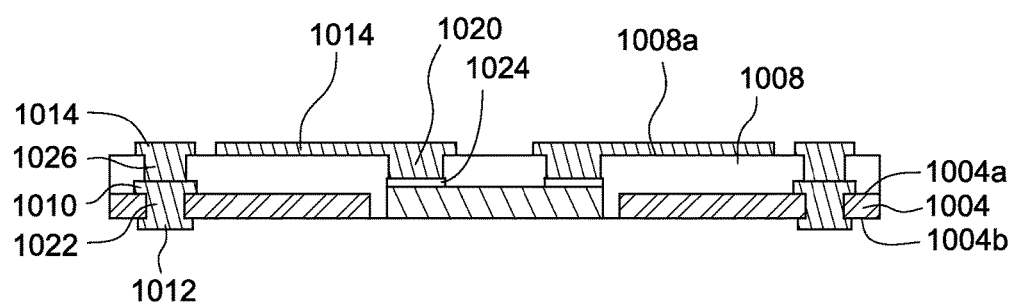

Referring to FIG. 10E, electrical interconnections 1020 and 1026 are formed by filling the through holes 1027, 1029, respectively, with conductive materials. The electrical interconnections 1020 and 1026 may be formed by the techniques described above. As shown in FIG. 10E, a third patterned conductive layer 1014 is formed on a surface of the first dielectric layer 1008, and a second patterned conductive layer 1012 is formed on the second surface 1004b of the substrate 1004. The third patterned conductive layer 1014 may include at least one pad and at least one trace, both of which may be formed in the same process. The third patterned conductive layer 1014 may be formed using the same techniques as those adopted for the first and second patterned conductive layers 1010, 1012, respectively.

Figure 10F:
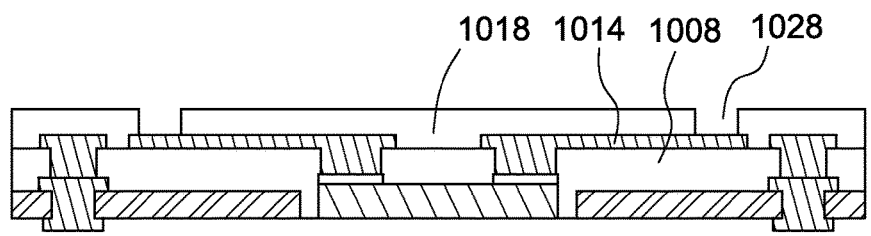

Referring to FIG. 10F, a second dielectric layer 1018 is formed on the first dielectric layer 1008 and the third patterned conductive layer 1014. The second dielectric layer 1018 may be formed by the techniques described above. As shown in FIG. 10F, the second dielectric layer 1018 may include at least one through hole 1028 to expose a portion of the third patterned conductive layer 1014 for external electrical connection. The exposed portion may be, for example, pads. The through holes may be formed by the techniques described above.

Figure 10G:
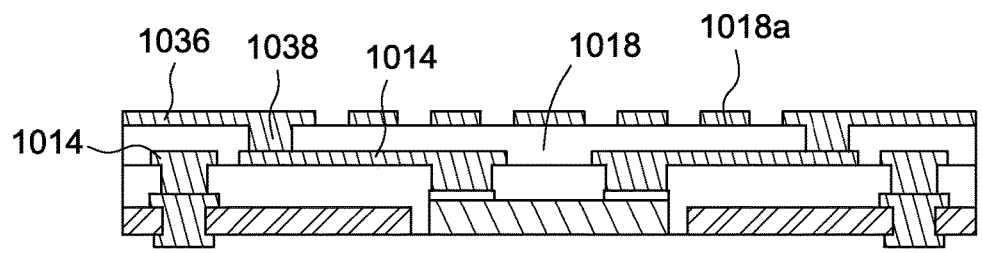

Referring to FIG. 10G, electrical interconnections 1038 are formed by filling the through holes 1028 exposing the third patterned conductive layer 1014 with conductive materials. The electrical interconnections 1038 may be formed by the techniques described above. As shown in FIG. 10G, a fourth patterned conductive layer 1036 is formed on an upper surface 1018a of the second dielectric layer 1018. The fourth patterned conductive layer 1036 electrically connects to the third patterned conductive layer 1014 through the electrical interconnections 1038. The fourth patterned conductive layer 1036 may be formed by the techniques described above. The fourth patterned conductive layer 1036 may include at least one pad and at least one trace, both of which may be formed in the same process.

Figure 10H:
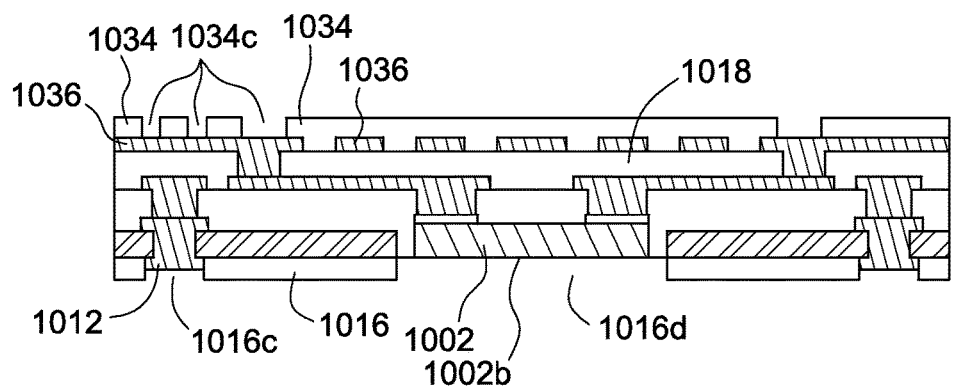

Referring to FIG. 10H, a third dielectric layer 1034 is formed on the second dielectric layer 1018 and the fourth patterned conductive layer 1036. The third dielectric layer 1034 includes openings 1034c to expose a portion of the fourth patterned conductive layer 1036 for external electrical connection. For example, the exposed portion can be ball pads on which solder balls of a ball grid array are formed, or can be pads which connect other components with wires. The openings 1034c may be formed by the techniques described above. The third dielectric layer 1034 may be a solder mask layer or a solder resist layer. For example, the third dielectric layer 1034 may be a solder mask layer formed of photosensitive dry films or may be formed with other patternable materials, such as polyimide, though not limited thereto In addition, a solder mask layer 1016 is provided on the second surface 1004b of the substrate 1004. The solder mask layer 1016 may be formed by the techniques described above. The solder mask layer 1016 includes openings 1016c to expose a portion of the second patterned conductive layer 1012 for providing external electrical connection. The solder mask 1016 includes openings 1016d to expose the back surface 1002b of the die 1002. The solder mask layer 1016 may be made of photosensitive dry films or other patternable materials, for example, polyimide, though not limited thereto. The openings 1016c may be formed by laser drilling, mechanical drilling or other suitable techniques.

Figure 10I:
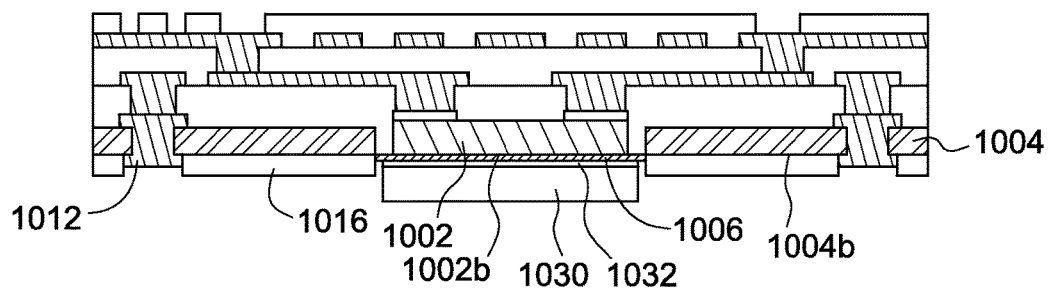

Referring to FIG. 10I, a first metal layer 1006 is formed on the back surface 1002b of the die 1002. The first metal layer 1006 may be formed by electroless plating or electroplating. In one embodiment, a heat sink 1030 is provided adjacent to the first metal layer 1006. The heat sink 1030 may attach to the first metal layer 1006 by adhesive layer 1032. In one embodiment, the adhesive layer 1032 is a thermally conductive adhesive (such as a thermal conductive silicone adhesive or a non-silicone type thermal conductive silicone adhesive and is coated on the surface of first metal layer 1006.

FIGS. 11A-11H illustrate a method for manufacturing an embedded component package structure according to another embodiment of the present disclosure, which is similar to the method illustrated in FIGS. 9A-9D and 9L, except that the second conductive foil on the second surface of the substrate is not removed in the step of FIG. 9B.

Figure 11A:
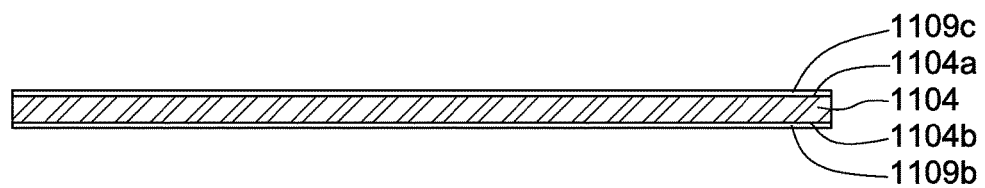
FIGS. 11A, 11B, 11C, 11D, 11E, 11F, 11G and 11H illustrate a method for manufacturing an embedded component package structure according to an embodiment of the present disclosure.

Referring to FIG. 11A, a substrate 1104 is provided and includes a first conductive foil 1109c on a first surface 1104a and a second conductive foil 1109b on a second surface 1104b.

Figure 11B:
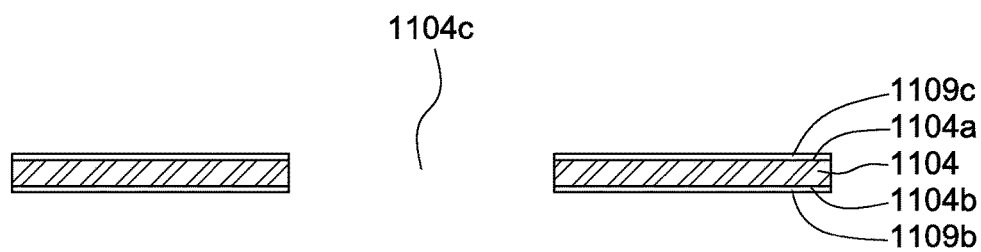

Referring to FIG. 11B, a through hole 1104c extending from the first conductive foil 1109c to the second conductive foil 1109b is formed in the substrate 1104. The through hole 1104c is used to receive die(s). The through hole 1104c may be formed by the techniques described above and has a width and a shape as described above.

Figure 11C:
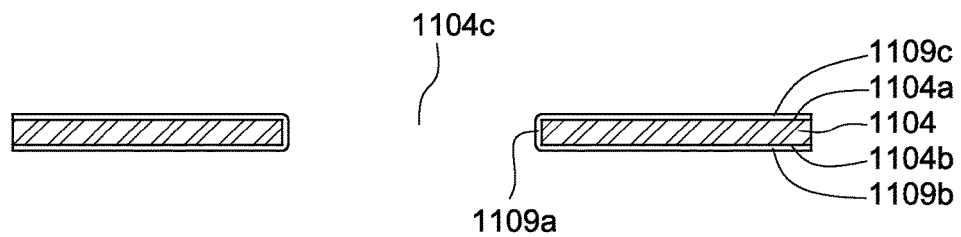

Referring to FIG. 11C, a shielding layer 1109a is formed on sidewalls of the through hole 1104c and covers all, or a portion of, the sidewalls. In one or more embodiments, an upper end of the shielding layer 1109a tapers toward the first conductive foil 1109c curvedly. In one or more embodiments, the lower end of the shielding layer 1109a tapers toward the second conductive foil 1109b curvedly. The shielding layer 1109a may connect the first conductive foil 1109c and the second conductive foil 1109b. The first shielding layer 1109a may be formed by sputtering or plating techniques, such as electroless plating and/or electroplating.

Figure 11D:
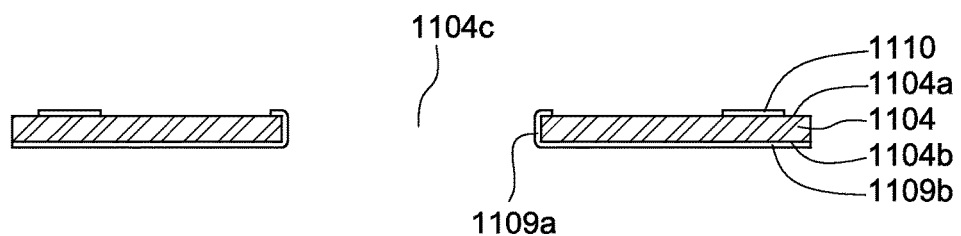

Referring to FIG. 11D, the first conductive foil 1109c is patterned to form a patterned conductive layer 1110 by the techniques described above.

Figure 11E:
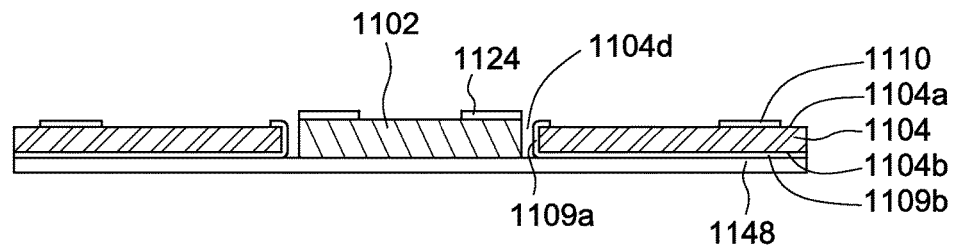

The step of FIG. 11E is similar to that of FIG. 9C, except that the adhesive film 1148 is provided on the second conductive foil 1109b of the substrate 1104 and covers all or part of the through hole 1104c. A die 1102 with pads 1124 is disposed in the through hole 1104c by attaching the die 1102 to the adhesive film 1148.

Figure 11F:
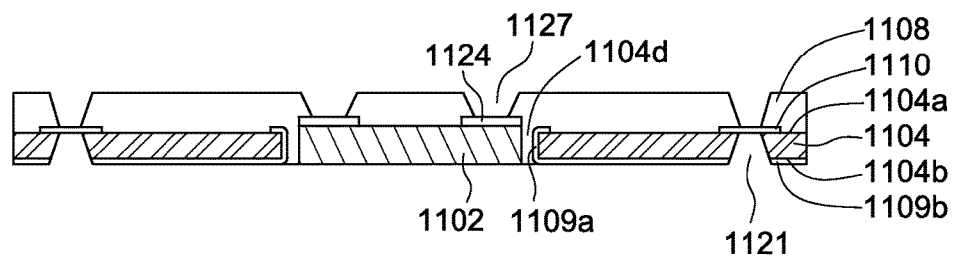

Referring to FIG. 11F, a first dielectric layer 1108 is provided on the first surface 1104a of the substrate 1104 and the die 1102, and the adhesive film 1148 is removed. At least one through hole 1127 is formed in the first dielectric layer 1108 to expose pads 1124 of the die 1102 and portions of the first patterned conductive layer 1110. At least one through hole 1121 is formed in the substrate 1104, and extends to the first surface 1104a so as to expose the first patterned conductive layer 1110. The formation of the first dielectric layer 1108, the through hole 1127 and the through hole 1121 is similar to that described with respect to FIG. 9D. As shown in FIG. 11F, a back surface of the die 1102 is substantially coplanar with a lower surface of the second conductive foil 1109b (the back surface of the die is lower than the lower surface 1104b of the substrate 1104).

Figure 11G:
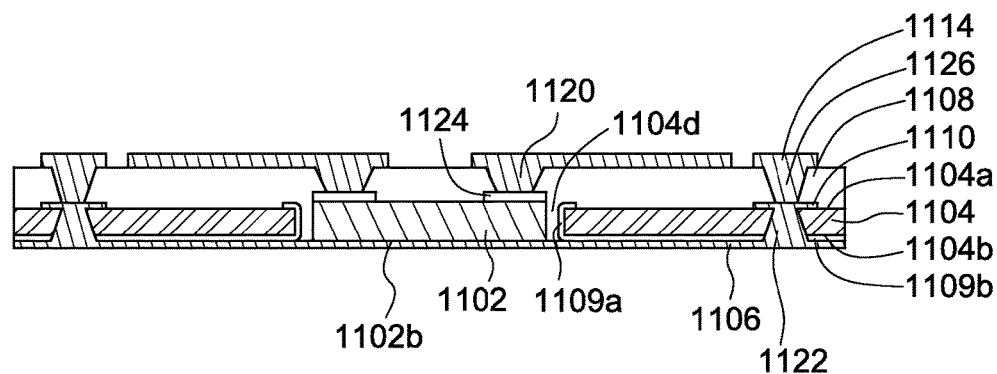

Referring to FIG. 11G, electrical interconnections 1120, 1122 and 1126 are formed by filling respective through holes with conductive materials; a patterned conductive layer 1114 is formed on a surface of the first dielectric layer 1108; and a first metal layer 1106 is formed directly on the back surface 1102b of the die 1102 and the second conductive foil 1109b (similar to the second metal layer 309b of FIG. 3C). In one or more embodiments, the first metal layer 1106 covers the entire back surface 1102b of the die 1102 and extends laterally so as to connect to the electrical interconnection 1122. In such embodiments, the first metal layer 1106 may also cover the entire lower surface of the second conductive foil 1109b and the lower surface of the first dielectric layer 1108. The formation of the electrical interconnections 1120, 1122 and 1126, the patterned conductive layer 1114 and the first metal layer 1106 is similar to the steps of forming the electrical interconnections 920, 922 and 926, the third patterned conductive layer 914 and the first metal layer 906 as described in FIG. 9L.

Figure 11H:
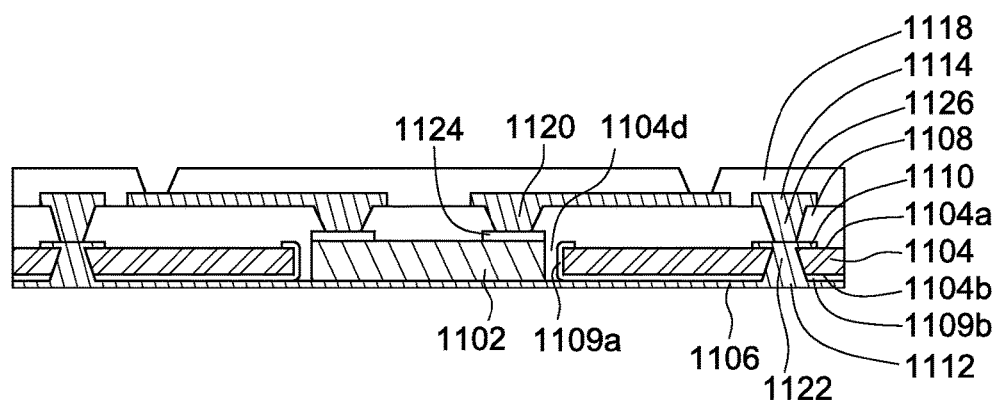

Referring to FIG. 11H, a second dielectric layer 1118 is provided on the first dielectric layer 1108 and covers the patterned conductive layer 1114. In addition, at least one through hole is formed in the second dielectric layer 1118 so as to expose a portion of the third patterned conductive layer 1114 for external electrical connection. The formation of the second dielectric layer 1118 and the through hole in the second dielectric layer 1118 is similar to that described in FIG. 9F.

The term "conductive layer" according to the present disclosure may refer to a patterned layer or non-patterned layer, depending on the function desired for this layer and the specifications of circuit design. For example, in the embodiment as described in FIG. 1A, conductive layers 110, 112 and 114 are patterned layers; in the embodiment as described in FIG. 3A, conductive layers 310 and 314 are patterned layers while conductive layer 312 can be a patterned layer or non-patterned layer.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An embedded component package structure, comprising:
    a substrate having a first surface and a second surface opposite the first surface, the substrate defining a through hole extending from the first surface to the second surface;
    a first conductive component extending from the first surface of the substrate to the second surface of the substrate;
    a first conductive layer disposed on the first surface of the substrate;
    a second conductive layer disposed on the second surface of the substrate and electrically connected to the first conductive layer by the first conductive component;
    at least one die disposed in the through hole, the die having an active surface and a back surface opposite the active surface, the back surface exposed from the second surface of the substrate;
    a first dielectric layer covering the active surface of the die and the first surface of the substrate;
    a second conductive component;
    a third conductive layer disposed on the first dielectric layer and electrically connected to the die by the second conductive component; and
    a first metal layer disposed directly on the back surface of the die, wherein the first metal layer extends laterally to the second conductive layer, and is electrically connected to the first conductive layer.

2. The embedded component package structure of claim 1, wherein the first metal layer and the second conductive layer are formed integrally.

3. The embedded component package structure of claim 1, wherein an area of the first conductive component exposed from the first surface of the substrate is smaller than an area of the first conductive component exposed from the second surface of the substrate.

4. The embedded component package structure of claim 1, further comprising:
   a solder mask layer covering the first dielectric layer and the third conductive layer and exposing a portion of the third conductive layer; and
   at least one active or passive component electrically connected to the third conductive layer.

5. The embedded component package structure of claim 1, further comprising:
   a second dielectric layer covering the first dielectric layer and the third conductive layer and exposing a portion of the third conductive layer;
   a fourth conductive layer disposed on the second dielectric layer and electrically connected to the third conductive layer by a third conductive component; and
   a solder mask layer covering the second dielectric layer and the fourth conductive layer and exposing a part of the fourth conductive layer; and
   at least one active or passive component electrically connected to the fourth conductive layer.

6. The embedded component package structure of claim 1, further comprising a metal shielding layer formed on side walls of the through hole defined by the substrate.

7. The embedded component package structure of claim 6, wherein the shielding layer has a first end curvedly tapering near the second surface of the substrate.

8. The embedded component package structure of claim 7, wherein the shielding layer has a second end curvedly tapering near the first surface of the substrate.

9. The embedded component package structure of claim 6, wherein the first metal layer extends laterally to the shielding layer and forms an electromagnetic shield together with the first metal layer.

10. The embedded component package structure of claim 1, wherein the back surface of the die is coplanar with the second surface of the substrate.

11. The embedded component package structure of claim 1, further comprising a second metal layer located between the substrate and the first metal layer and covering the second surface of the substrate.

12. The embedded component package structure of claim 11, wherein the back surface of the die is lower than the second surface of the substrate.

13. The embedded component package structure of claim 1, wherein the first metal layer covers an entirety of the back surface of the die.

* * * * *